US012751208B2

(12) United States Patent
Kobayashi et al.

(10) Patent No.: US 12,751,208 B2
(45) Date of Patent: Sep. 29, 2026

(54) PIEZOELECTRIC ELEMENT AND ACTUATOR

(71) Applicant: FUJIFILM CORPORATION, Tokyo (JP)

(72) Inventors: Hiroyuki Kobayashi, Kanagawa (JP); Seigo Nakamura, Kanagawa (JP); Shinya Sugimoto, Kanagawa (JP); Tsutomu Sasaki, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 609 days.

(21) Appl. No.: 18/454,073

(22) Filed: Aug. 23, 2023

(65) Prior Publication Data

US 2024/0114797 A1 Apr. 4, 2024

(30) Foreign Application Priority Data

Sep. 30, 2022 (JP) ................................ 2022-158870

(51) Int. Cl.
*H10N 30/50* (2023.01)
*H10N 30/20* (2023.01)
(Continued)

(52) U.S. Cl.
CPC ........... *H10N 30/50* (2023.02); *H10N 30/206* (2023.02); *H10N 30/802* (2023.02); *H10N 30/8554* (2023.02)

(58) Field of Classification Search
CPC .... H10N 30/50; H10N 30/206; H10N 30/802; H10N 30/8554; H10N 30/704; H10N 30/20
See application file for complete search history.

(56) References Cited

U.S. PATENT DOCUMENTS 5,233,256 A 8/1993 Hayashi et al.
10,020,443 B2 * 7/2018 Naono ................ H10N 30/076
(Continued)

FOREIGN PATENT DOCUMENTS

CN 117812989 A * 4/2024 ............ H10N 30/20
CN 119730697 A * 3/2025 .......... H10N 30/871
(Continued)

OTHER PUBLICATIONS

Extended European Search Report dated Feb. 27, 2024, issued in corresponding EP Patent Application No. 23192851.6.
(Continued)

*Primary Examiner* — Pedro J Cuevas
(74) *Attorney, Agent, or Firm* — SOLARIS Intellectual Property Group, PLLC

(57) ABSTRACT

A piezoelectric element includes a substrate, a first electrode, a first piezoelectric film, a second electrode, a second piezoelectric film, and a third electrode, in which both the first piezoelectric film and the second piezoelectric film have spontaneous polarizations aligned in a film thickness direction and directions of the spontaneous polarizations are the same, and in a case where in a hysteresis curve of one piezoelectric film, a coercive voltage $Vcf^+$, a coercive voltage $Vcf^-$, $|Vcf^+-Vcf^-|=\Delta Vcf$, and the larger of an absolute value of $Vcf^+$ and an absolute value of $Vcf^-$ is denoted by Vcf, and in a hysteresis curve of the other piezoelectric film, a coercive voltage $Vcr^+$, a coercive voltage $Vcr^-$, $|Vcr^+-Vcr^-|=\Delta Vcr$, and the larger of an absolute value of $Vcr^+$ and an absolute value $Vcr^-$ is denoted by Vcr, $\Delta Vcr<\Delta Vcf-0.2$ and $Vcr<Vcf-0.2$ are satisfied.

9 Claims, 15 Drawing Sheets

(51) Int. Cl.
*H10N 30/80* (2023.01)
*H10N 30/853* (2023.01)

(56) References Cited

U.S. PATENT DOCUMENTS

| | | | | |
|---|---|---|---|---|
| 11,758,817 | B2 * | 9/2023 | Kijima | C23C 14/08 |
| 2009/0026887 | A1 | 1/2009 | Fujii et al. | |
| 2009/0243438 | A1 * | 10/2009 | Hamada | B41J 2/045 347/68 |
| 2013/0099627 | A1 | 4/2013 | Fujii et al. | |
| 2013/0147880 | A1 * | 6/2013 | Hamada | B41J 2/045 347/68 |
| 2013/0229465 | A1 | 9/2013 | Fujii et al. | |
| 2014/0167562 | A1 | 6/2014 | Hibino | |
| 2015/0054387 | A1 | 2/2015 | Li et al. | |
| 2018/0108829 | A1 * | 4/2018 | Naono | H10N 30/704 |
| 2018/0188214 | A1 * | 7/2018 | Oono | H10N 30/50 |
| 2019/0123257 | A1 * | 4/2019 | Kijima | C23C 14/08 |
| 2020/0411747 | A1 | 12/2020 | Wagner et al. | |
| 2024/0023452 | A1 * | 1/2024 | Kobayashi | H10N 30/8554 |
| 2024/0023454 | A1 * | 1/2024 | Kobayashi | H10N 30/878 |
| 2024/0114793 | A1 * | 4/2024 | Kobayashi | H10N 30/101 |
| 2024/0114796 | A1 * | 4/2024 | Nakamura | H10N 30/704 |
| 2024/0114801 | A1 * | 4/2024 | Nakamura | H10N 30/8554 |
| 2025/0098542 | A1 * | 3/2025 | Kobayashi | H10N 30/076 |
| 2025/0107449 | A1 * | 3/2025 | Sasaki | H10N 30/8554 |
| 2025/0234785 | A1 * | 7/2025 | Kiuchi | G01C 19/5628 |
| 2025/0275477 | A1 * | 8/2025 | Kobayashi | H10N 30/045 |

FOREIGN PATENT DOCUMENTS

| | | | | |
|---|---|---|---|---|
| DE | 102018203812 | A1 | 9/2019 | |
| DE | 102024127647 | A1 * | 3/2025 | H10N 30/871 |
| EP | 4346359 | A1 * | 4/2024 | H10N 30/20 |
| EP | 4629810 | A1 * | 10/2025 | H10N 30/8554 |
| JP | H04-245488 | A | 9/1992 | |
| JP | 2009-054994 | A | 3/2009 | |
| JP | 2013-080886 | A | 5/2013 | |
| JP | 2013-080887 | A | 5/2013 | |
| JP | 2016-534563 | A | 11/2016 | |
| JP | 2021-520074 | A | 8/2021 | |
| JP | 2024052270 | A * | 4/2024 | H10N 30/20 |
| JP | 2025056522 | A * | 4/2025 | H10N 30/871 |
| WO | 2013/191249 | A1 | 12/2013 | |
| WO | WO-2024116761 | A1 * | 6/2024 | H10N 30/8554 |
| WO | WO-2026042446 | A1 * | 2/2026 | B06B 1/06 |

OTHER PUBLICATIONS

English language translation of the following: Office action dated May 26, 2025 from the JPO in a Japanese patent application No. 2022-158870 corresponding to the instant patent application. This office action translation is submitted now in order to supplement the understanding of the cited references which are being disclosed in the instant Information Disclosure Statement.

* cited by examiner

SECOND PIEZOELECTRIC FILM OF EXAMPLE 4

PIEZOELECTRIC ELEMENT AND ACTUATOR

CROSS REFERENCE TO RELATED APPLICATIONS

This application claims priority from Japanese Application No. 2022-158870, filed on Sep. 30, 2022, the entire disclosure of which is incorporated herein by reference.

BACKGROUND

1. Technical Field

The present disclosure relates to a piezoelectric element and an actuator.

2. Related Art

As a material having excellent piezoelectric characteristics and excellent ferroelectricity, there is known a perovskite-type oxide such as lead zirconate titanate ($Pb(Zr,Ti)O_3$, hereinafter referred to as PZT). A piezoelectric body consisting of a perovskite-type oxide is applied as a piezoelectric film in a piezoelectric element comprising a lower electrode, a piezoelectric film, and an upper electrode on a substrate. This piezoelectric element has been developed into various devices such as a memory, an inkjet head (an actuator), a micromirror device, an angular velocity sensor, a gyro sensor, a piezoelectric micromachined ultrasonic transducer (PMUT), and an oscillation power generation device.

As the piezoelectric element, in order to obtain high piezoelectric characteristics, a multilayered piezoelectric element in which a plurality of piezoelectric films are laminated via an electrode layer has been proposed.

For example, JP2013-80886A proposes a piezoelectric element in which a first electrode, a Nb-doped PZT film, a second electrode, a Nb-doped PZT film, and a third electrode are laminated in this order. It is known that the Nb-doped PZT film has a direction of a spontaneous polarization that is aligned upward with respect to the substrate during film formation. That is, both of two layers of Nb-doped PZT films in JP2013-80886A have a spontaneous polarization of which a direction is aligned upward. In general, for the piezoelectric film having the spontaneous polarization of which a direction is aligned, higher piezoelectric performance can be obtained by applying an electric field in the same direction as the direction of the spontaneous polarization. Therefore, in JP2013-80886A, the electric field in the same direction as the direction of the spontaneous polarization is applied to each of two Nb-doped PZT films by a first driving method in which a second electrode is grounded, a positive voltage (+V) is applied to a first electrode, and a negative voltage (−V) is applied to a third electrode, a second driving method in which the first electrode is grounded, a negative voltage (−V) is applied to the second electrode, and a negative voltage (−2V) that is larger in absolute value than that of the second electrode is applied to the third electrode, or the like. As a result, a displacement amount that is substantially twice that of the piezoelectric element having only one layer is realized.

Further, JP2013-80887A proposes a piezoelectric element in which a first electrode, a first piezoelectric film, a second electrode, a second piezoelectric film, and a third electrode are laminated in this order, and a direction in which a spontaneous polarization of the first piezoelectric film is aligned and a direction in which a spontaneous polarization of the second piezoelectric film is aligned are different from each other. Further, as a specific example, a case where the first piezoelectric film is a Nb-doped PZT film and the second piezoelectric film is a PZT film without Nb addition (hereinafter, referred to as pure PZT) is illustrated. The Nb-doped PZT film has a direction of the spontaneous polarization which is aligned in a state in which a poling treatment is not performed, and the pure PZT film has a direction of the spontaneous polarization which is not aligned in a state in which the poling treatment is not performed. Therefore, by performing the poling treatment on the pure PZT film such that the spontaneous polarization is aligned in a direction opposite to the direction of the spontaneous polarization of the Nb-doped PZT film, the direction of the spontaneous polarization of the first piezoelectric film and the direction of the spontaneous polarization of the second piezoelectric film are made different. In JP2013-80887A, by setting the first electrode and the third electrode of the piezoelectric element to have the same potential and using the second electrode as a drive electrode, an electric field in the same direction as the direction of the spontaneous polarization is applied to each of the first piezoelectric film and the second piezoelectric film. Accordingly, piezoelectric performance corresponding to two layers of piezoelectric films can be obtained with a voltage large enough to drive one layer of piezoelectric film, so that high piezoelectric performance can be obtained at a low voltage.

SUMMARY

However, in JP2013-80886A, in order to obtain piezoelectric performance equivalent to that of the first driving method in the second driving method in which a voltage having an absolute value larger than that of the second electrode is applied to the third electrode, it is necessary to apply a very large voltage to the third electrode and sufficient piezoelectric performance cannot be obtained at a low voltage. In order to carry out the first driving method in which voltages of different signs are applied to the first electrode and the third electrode, it is necessary to provide a positive drive circuit and a negative drive circuit, which leads to high costs.

In addition, in the piezoelectric element of JP2013-80887A, very good piezoelectric performance can be obtained. However, in order to manufacture the piezoelectric element of JP2013-80887A, for example, the first piezoelectric film and the second piezoelectric film need to be composed of piezoelectric films containing different materials such that the first piezoelectric film is a Nb-doped PZT film and the second piezoelectric film is a pure PZT film. Therefore, in order to form the first piezoelectric film and the second piezoelectric film, two different targets are required, and at least one of the piezoelectric films needs to be subjected to the poling treatment, so that sufficient cost reduction cannot be achieved.

As described above, the piezoelectric element that can obtain high piezoelectric performance is expensive or requires application of a high voltage, and a low-cost piezoelectric element that can obtain high piezoelectric performance at a low voltage has not been realized.

An object of the present disclosure is to provide a piezoelectric element and a piezoelectric actuator capable of obtaining high piezoelectric performance at a low voltage at low costs.

A piezoelectric element according to an aspect of the present disclosure comprises a substrate; and a first electrode, a first piezoelectric film, a second electrode, a second piezoelectric film, and a third electrode which are provided on the substrate in this order, in which both the first piezoelectric film and the second piezoelectric film have spontaneous polarizations aligned in a film thickness direction and directions of the spontaneous polarizations of the first piezoelectric film and the second piezoelectric film are the same, and in a case where in a hysteresis curve showing polarization-voltage characteristics of one piezoelectric film of the first piezoelectric film and the second piezoelectric film, a coercive voltage on a positive side is denoted by $Vcf^+$, a coercive voltage on a negative side is denoted by $Vcr^-$, an absolute value $|Vcf^+-Vcf^-|$ of a difference between both coercive voltages is denoted by ΔVcf, and the larger of an absolute value of the coercive voltage $Vcf^+$ and an absolute value of the coercive voltage $Vcf^-$ is denoted by Vcf, and in a hysteresis curve showing polarization-voltage characteristics of the other piezoelectric film of the first piezoelectric film and the second piezoelectric film, a coercive voltage on a positive side is denoted by $Vcr^+$, a coercive voltage on a negative side is denoted by $Vcr^-$, an absolute value $|Vcr^+-Vcr^-|$ of a difference between both coercive voltages is denoted by ΔVcr, and the larger of an absolute value of the coercive voltage $Vcr^+$ and an absolute value of the coercive voltage $Vcr^-$ is denoted by Vcr, $\Delta Vcr<\Delta Vcf-0.2$ and $Vcr<Vcf-0.2$, where, units are all [V], are satisfied.

It is preferable that $|Vcr^++Vcr^-|\leq\Delta Vcr$ is further satisfied.

It is preferable that an electric field in the same direction as a direction of the spontaneous polarization is applied to the one piezoelectric film, and an electric field in a direction opposite to the direction of the spontaneous polarization is applied to the other piezoelectric film.

It is preferable that the first electrode and the third electrode are connected to each other.

It is preferable that both the first piezoelectric film and the second piezoelectric film contain a perovskite-type oxide represented by General Formula $Pb\{(Zr_xTi_{1-x})_{1-y}M_y\}O_3$, where M is a metal element selected from the group consisting of V, Nb, Ta, Sb, Mo, and W, and $0<x<1$, and $0<y<1$ are satisfied.

It is preferable that the metal element M is Nb and y is greater than 0.1.

The first piezoelectric film and the second piezoelectric film may have the same composition.

In a case where the first piezoelectric film and the second piezoelectric film have the same composition, it is preferable that a film thickness of the other piezoelectric film is thinner than a film thickness of the one piezoelectric film.

An actuator according to another aspect of the present disclosure is an actuator comprising: the piezoelectric element according to the aspect of the present disclosure; and a drive circuit that applies a drive voltage to the piezoelectric element, in which the drive circuit applies an electric field in the same direction as a direction of the spontaneous polarization to the one piezoelectric film, and applies an electric field in a direction opposite to the direction of the spontaneous polarization to the other piezoelectric film.

According to a technology of the present disclosure, it is possible to provide a piezoelectric element and a piezoelectric actuator capable of obtaining high piezoelectric performance at a low voltage at low costs.

DESCRIPTION OF EMBODIMENTS

Figure 1:
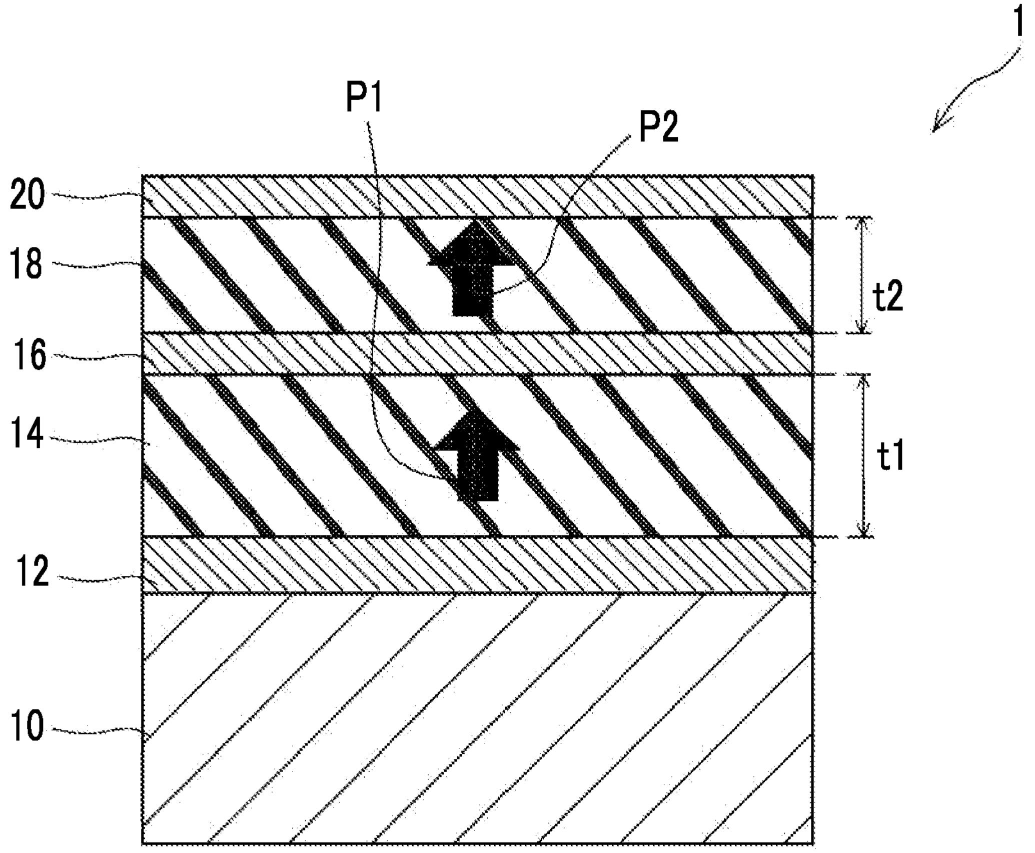
FIG. 1 is a cross-sectional view of a piezoelectric element according to one embodiment.

Hereinafter, embodiments according to the present invention will be described with reference to the drawings. In the drawings below, a layer thickness of each of layers and a ratio therebetween are depicted with appropriate changes for easy visibility, and thus they do not necessarily reflect the actual layer thickness and ratio.

FIG. 1 is a cross-sectional schematic view showing a layer configuration of a piezoelectric element according to one embodiment. As shown in FIG. 1, a piezoelectric element 1 comprises a first electrode 12, a first piezoelectric film 14, a second electrode 16, a second piezoelectric film 18, and a third electrode 20 which are laminated on a substrate 10 in this order.

The substrate 10 is not particularly limited, and examples thereof include silicon, glass, stainless steel, yttrium-stabilized zirconia, alumina, sapphire, silicon carbide, or other substrates. As the substrate 10, a laminated substrate such as a thermal oxide film-attached silicon substrate having a $SiO_2$ oxide film formed on a surface of a silicon substrate may be used. Further, as the substrate 10, a resin substrate such as polyethylene terephthalate (PET), polyethylene naphthalata (PEN), polyimide, and the like may be used.

The first electrode 12 is formed on the substrate 10. The main component of the first electrode 12 is not particularly limited, and examples thereof include metals such as gold (Au), platinum (Pt), iridium (Ir), ruthenium (Ru), titanium (Ti), molybdenum (Mo), tantalum (Ta), and aluminum (Al) or metal oxides, and combinations thereof. In addition, indium tin oxide (ITO), $LaNiO_3$, $SrRuO_3$ (SRO), or the like may be used.

The second electrode 16 is laminated on the first piezoelectric film 14, and the third electrode 20 is laminated on the second piezoelectric film 18. The first electrode 12 and the second electrode 16 are paired with each other to apply an electric field to the first piezoelectric film 14. In addition, the second electrode 16 and the third electrode 20 are paired with each other to apply an electric field to the second piezoelectric film 18.

The main components of the second electrode 16 and the third electrode 20 are not particularly limited, and examples thereof include, in addition to the materials exemplified for the first electrode 12, electrode materials that are generally used in a semiconductor process such as chromium (Cr) and combinations thereof. However, it is preferable to use an oxide conductor for the layer in contact with the first piezoelectric film 14 or the second piezoelectric film 18. Specific examples of an oxide conductor layer include indium tin oxide (ITO), Ir oxide, and $SrRuO_3$ (SRO), as well as $LaNiO_3$ and a doped ZnO.

The thicknesses of the first electrode 12, the second electrode 16, and the third electrode 20 are not particularly limited and are preferably about 50 nm to 300 nm, and more preferably 100 nm to 300 nm.

Both the first piezoelectric film 14 and the second piezoelectric film 18 have spontaneous polarizations aligned in the film thickness direction, and the directions in which the spontaneous polarizations are aligned are the same. In the example shown in FIG. 1, the direction of the spontaneous polarization P1 of the first piezoelectric film 14 and the direction of the spontaneous polarization P2 of the second piezoelectric film 18 are both upward in the film thickness direction. In addition, in this specification, with reference to the substrate 10, a direction away from the substrate 10 is defined as upward, and a substrate side is defined as downward. Whether or not the spontaneous polarization in the piezoelectric film is aligned and the direction in which the spontaneous polarization is aligned can be confirmed by measuring a P-V hysteresis curve (or P-E hysteresis curve) showing polarization-voltage characteristics (or polarization-electric field characteristics) of the piezoelectric film.

In the piezoelectric film that has not been subjected to the poling treatment, the reason why the direction of the spontaneous polarization is aligned in a state in which an external electric field is not applied is thought to be due to generation of an electric field caused by distortion or defect of a crystal structure (hereinafter referred to as a spontaneous internal electric field) in the piezoelectric film. In a case of a piezoelectric film in which a spontaneous internal electric field is not generated in a state in which an external electric field is not applied, the P-E hysteresis curve (or P-V hysteresis curve) depicts a shape whose center coincides with an origin. On the other hand, in a case of a piezoelectric film in which a spontaneous internal electric field is generated, that is, a piezoelectric film in which the direction of the spontaneous polarization is aligned in a state in which the external electric field is not applied, the center of the hysteresis curve is deviated (shifted) from the origin because the direction of the spontaneous polarization is aligned with respect to the spontaneous internal electric field. In a case of the P-E hysteresis curve, assuming that the spontaneous internal electric field is Ei and the external electric field applied from the outside is Eo, an electric field of Ei+Eo is applied, so that the center of the hysteresis curve is shifted from the origin by an amount of the spontaneous internal electric field Ei. In a case of the P-V hysteresis curve, the center of the hysteresis curve is shifted from the origin by the product of Ei and the film thickness. Therefore, in a case where the center of the measured hysteresis curve is shifted from the origin, it can be considered that the spontaneous internal electric field is generated and the spontaneous polarization is aligned. The amount of shift of the center of the hysteresis curve from the origin is proportional to an alignment degree of the spontaneous polarization, and a larger shift amount means that the alignment degree of the spontaneous polarization is higher (the spontaneous internal electric field is larger). In addition, it is possible to specify the direction of the spontaneous polarization that is aligned by a shift direction of the hysteresis curve from the origin. In a case of the P-V hysteresis curve, the center of the hysteresis is defined as a midpoint between two coercive voltages described below.

Hereinafter, the term "direction of the spontaneous polarization" means the direction of the spontaneous polarization aligned by the spontaneous internal electric field.

Figure 2A:
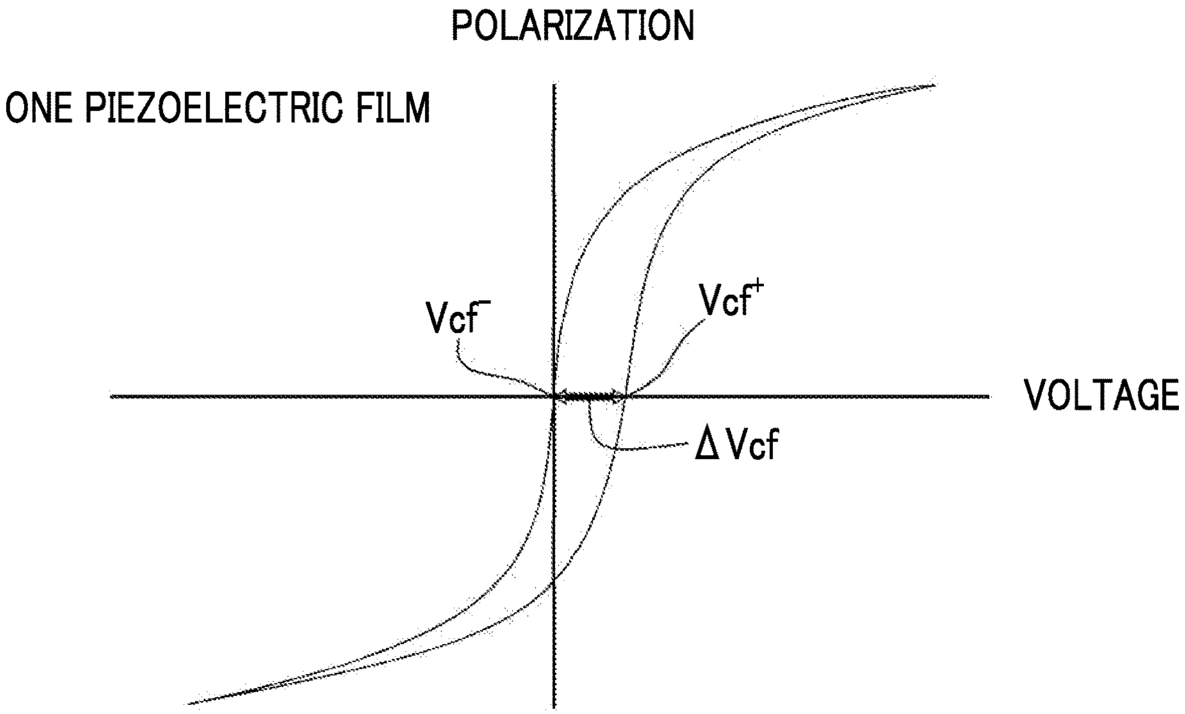
FIG. 2A is a diagram showing a polarization-voltage hysteresis curve of one piezoelectric film.

FIG. 2A shows a hysteresis curve of one piezoelectric film of the first piezoelectric film 14 and the second piezoelectric film 18. It is assumed that a coercive voltage on the positive side of the one piezoelectric film is $Vcf^+$, a coercive voltage on the negative side of the one piezoelectric film is $Vcf^-$, and an absolute value $|Vcf^+-Vcf^-|$ of a difference between both coercive voltages is $\Delta Vcf$. Further, the larger of an absolute value of the coercive voltage $Vcf^+$ on the positive side and an absolute value of the coercive voltage $Vcf^-$ on the negative side is defined as a coercive voltage Vcf. In a case of FIG. 2A, Vcf is the coercive voltage $Vcf^+$ on the positive side.

Figure 2B:
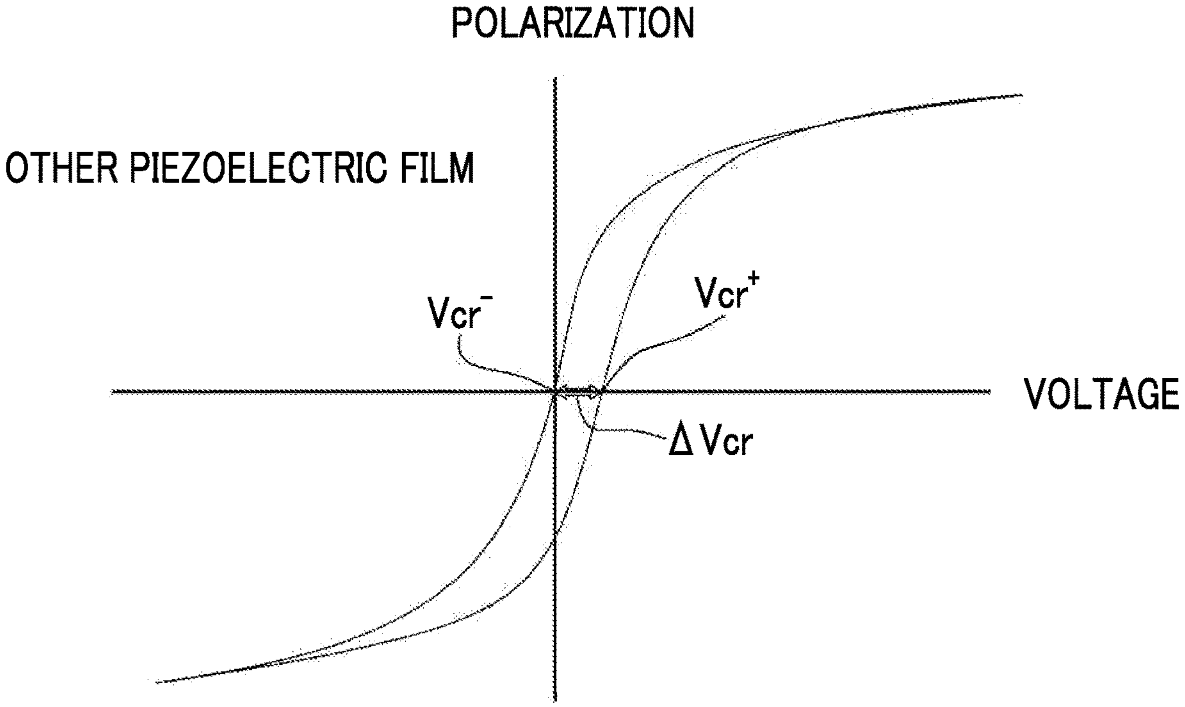
FIG. 2B is a diagram showing a polarization-voltage hysteresis curve of the other piezoelectric film.

FIG. 2B shows a hysteresis curve of the other piezoelectric film of the first piezoelectric film 14 and the second piezoelectric film 18. It is assumed that a coercive voltage on the positive side of the other piezoelectric film is $Vcr^+$, a coercive voltage on the negative side of the other piezoelectric film is $Vcr^-$, and an absolute value $|Vcr^+-Vcr^-|$ of a difference between both coercive voltages is $\Delta Vcr$. Further, the larger of an absolute value of the coercive voltage $Vcr^+$ on the positive side and an absolute value of the coercive voltage $Vcr^-$ on the negative side is defined as a coercive voltage Vcr. In a case of FIG. 2B, Vcr is the coercive voltage $Vcr^+$ on the positive side.

The piezoelectric element 1 satisfies $\Delta Vcr<\Delta Vcf-0.2$ and $Vcr<Vcf-0.2$ (1).

It is preferable that $\Delta Vcf\times0.5<\Delta Vcr$.

The first piezoelectric film 14 may be the one piezoelectric film showing the hysteresis curve shown in FIG. 2A, the second piezoelectric film 18 may be the other piezoelectric film showing the hysteresis curve shown in FIG. 2B, or conversely, the second piezoelectric film 18 may be the one piezoelectric film showing the hysteresis curve shown in FIG. 2A, and the first piezoelectric film 14 may be the other piezoelectric film showing the hysteresis curve shown in FIG. 2B.

The coercive voltage is a voltage at which the polarization is zero in the hysteresis curve, and as shown in FIGS. 2A and 2B, there are two coercive voltages in one hysteresis curve. The coercive voltage on the positive side refers to a coercive voltage on a relatively positive voltage side (right side in the figure) of the two negative voltages, and the coercive voltage on the negative side refers to a coercive voltage on a relatively negative voltage side (left side in the figure). Both the coercive voltage on the positive side and the coercive voltage on the negative side may be positive values, or the coercive voltage on the positive side may be a positive value and the coercive voltage on the negative side may be a negative value.

FIGS. 2A and 2B are hysteresis curves of one and the other piezoelectric films obtained by grounding the lower electrodes 12 and 16 of the piezoelectric films 14 and 18, using the upper electrodes 16 and 20 as drive electrodes, and applying a sweep voltage to the piezoelectric films 14 and 18. In this case, both the hysteresis curve of the first piezoelectric film 14 and the hysteresis curve of the second piezoelectric film 18 are shifted from the origin of the hysteresis curve in the same electric field direction (positive electric field direction in FIGS. 2A and 2B). The hysteresis curves of one and the other piezoelectric films obtained by grounding the upper electrodes 16 and 20 of the piezoelectric films 14 and 18, using the lower electrodes 12 and 16 as drive electrodes, and applying a sweep voltage to the piezoelectric films 14 and 18 are obtained by rotating the hysteresis curves shown in FIGS. 2A and 2B about the origin by 180°. In the measurement of the P-V characteristics of the first piezoelectric film 14 and the second piezoelectric film 18, either the upper electrode or the lower electrode may be used as the drive electrode.

As shown in FIG. 2A, ΔVcf corresponds to a width of the hysteresis curve of the one piezoelectric film, and ΔVcr corresponds to a width of the hysteresis curve of the other piezoelectric film. As shown in FIGS. 2A and 2B, the coercive voltage is specified from the hysteresis measured for each piezoelectric film, and the measured value includes a measurement error of about ±0.2 V. Therefore, a range of ΔVcf±0.2 [V] is considered to be equivalent to ΔVcf. Satisfying ΔVcr<ΔVcf−0.2 means that the width of the hysteresis curve of the other piezoelectric film is smaller than the width of the hysteresis curve of the one piezoelectric film, and "−0.2" on the right side takes the measurement error into account.

Vcr<Vcf−0.2 indicates that the coercive voltage Vcr of the other piezoelectric film is smaller than the coercive voltage Vcf of the one piezoelectric film. This means that a voltage at which polarization reversal occurs in a case where an electric field in a direction opposite to the direction of the spontaneous polarization is applied to the other piezoelectric film is smaller than a voltage at which polarization reversal occurs in a case where an electric field in a direction opposite to the direction of the spontaneous polarization is applied to the one piezoelectric film. Again, "−0.2" on the right side takes the measurement error into account. The range of Vcf±0.2 [V] is considered to be equivalent to Vcf.

The coercive voltage Vc is represented by the product of a coercive electric field Ec and a film thickness t. Therefore, in a case where a difference in the coercive electric field of the one piezoelectric film is denoted by ΔEcf, a film thickness of the one piezoelectric film is denoted by tf, a difference in the coercive electric field of the other piezoelectric film is denoted by ΔEcr. and a film thickness of the other piezoelectric film is denoted by tr, ΔVcf=ΔEcf×tf, and ΔVcr=ΔEcr×tr are established.

For example, in a case where the first piezoelectric film 14 and the second piezoelectric film 18 are composed of piezoelectric bodies having exactly the same composition, a configuration satisfying the above expression (1) can be made by making the film thickness tr of the other piezoelectric film thinner than the film thickness tf of the one piezoelectric film (tr<tf). In a case where the first piezoelectric film 14 and the second piezoelectric film 18 have the same composition, it is preferable that the film thickness tr of the other piezoelectric film is 0.4 to 0.9 times the film thickness tf of one piezoelectric film.

In the example shown in FIG. 1, a film thickness t1 of the first piezoelectric film 14 is tf, and a film thickness t2 of the second piezoelectric film 18 is tr. That is, FIG. 1 shows an example in which the first piezoelectric film 14 is the one piezoelectric film having the hysteresis curve of FIG. 2A, and the second piezoelectric film 18 is the other piezoelectric film having the hysteresis curve of FIG. 2B.

In a case where the first piezoelectric film 14 and the second piezoelectric film 18 are composed of different piezoelectric bodies, and the difference ΔEcf in the coercive electric field of the one piezoelectric film is larger than the difference ΔEcr in the coercive electric field of the other piezoelectric film, the equation (1) can be satisfied even in a case where the film thickness tf of the one piezoelectric film and the film thickness tr of the other piezoelectric film have a relationship of tf≤tr. However, it is preferable that the first piezoelectric film 14 and the second piezoelectric film 18 are composed of piezoelectric bodies having the same composition, because materials can be shared and manufacturing costs can be suppressed.

It is preferable that the piezoelectric element 1 further satisfies $|Vcr^{+}+Vcr^{-}|\leq\Delta Vcr$. The center of the hysteresis curve of the other piezoelectric film is represented by $(Vcr^{+}+Vcr^{-})/2$. Therefore, $|Vcr^{+}+Vcr^{-}|\leq\Delta Vcr$ means that a distance between the center of the hysteresis curve and the origin is less than or equal to half the hysteresis width, that is, the hysteresis curve includes the origin. In a case where the shift amount of the hysteresis curve of the other piezoelectric film is smaller, the coercive voltage Vcr can be suppressed to be relatively small.

There are no particular restrictions on the piezoelectric bodies constituting the first piezoelectric film 14 and the second piezoelectric film 18, as long as a film in which the direction of the spontaneous polarization is aligned in the film thickness direction immediately after film formation can be obtained, and the above expression (1) is satisfied. It is preferable that the first piezoelectric film 14 and the second piezoelectric film 18 contain a perovskite-type oxide as a main component. Here, the main component means a component that occupies 80 mol % or more. It is preferable that 90 mol % or more of each of the first piezoelectric film 14 and the second piezoelectric film 18 is occupied by the perovskite-type oxide, and it is more preferable that the first piezoelectric film 14 and the second piezoelectric film 18 are composed of the perovskite-type oxide (however, containing unavoidable impurities).

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (2), which contains the metal element M, as an additive, at the B site of PZT.

$$Pb\{(Zr_xTi_{1-x})_{1-y}M_y\}O_3 \quad (2)$$

Here, the metal element M is preferably one or more elements selected from vanadium (V), niobium (Nb), tantalum (Ta), antimony (Sb), molybdenum (Mo), and tungsten (W). Here, 0<x<1 and 0<y<1 are satisfied. Further, in General Formula (2), regarding $Pb:\{(Zr_xTi_{1+x})_{1-y}M_y\}:O$, a reference ratio is 1:1:3; however, the ratio may deviate within a range in which a perovskite structure can be obtained. Hereinafter, $Pb_a\{(Zr_xTi_{1-x})_{1-y}M_y\}O_3$ will be referred to as M-doped PZT. In addition, for example, in a case where the metal element M is Nb, it is referred to as Nb-doped PZT.

The metal element M may be a single element such as V only or Nb only, or it may be a combination of two or three or more elements, such as a mixture of V and Nb or a mixture of V, Nb, and Ta. In a case where the metal element M is these elements, a very high piezoelectric constant can be realized in combination with Pb of the A site element.

In particular, $Pb\{(Zr_xTi_{1-x})_{1-y}Nb_y\}O_3$ in which the metal element M is Nb is optimal. Here, in a case where $y>0.1$, a higher piezoelectric constant can be obtained. In a case of forming a piezoelectric film by a vapor phase growth method such as sputtering using Nb-doped PZT in which M is Nb, a piezoelectric film having a very high piezoelectric constant in which the spontaneous polarization is more aligned upward in the film thickness direction from the substrate can be obtained.

It is preferable that the perovskite-type oxide of the first piezoelectric film 14 and the perovskite-type oxide of the second piezoelectric film 18 have the same composition. Here, in a case where each element symbol indicates a molar ratio of each element, it is assumed that in the perovskite-type oxide, the Pb composition ratio is Pb/(Zr+Ti+M), the Zr composition ratio at the B site is Zr/(Zr+Ti), the Ti composition ratio at the B site is Ti/(Zr+Ti), and the M composition ratio which is a composition ratio of the metal element M at the B site is M/(Zr+Ti+M). The fact that the perovskite-type oxide of the first piezoelectric film 14 and the perovskite-type oxide of the second piezoelectric film 18 have the same composition means that the Pb composition ratios, the Zr composition ratios, the Ti composition ratios, and the M composition ratios are equal to each other, respectively, within the measurement error.

The film thicknesses t1 and t2 of the first piezoelectric film 14 and the second piezoelectric film 18 are preferably 0.2 μm or more and 5 μm or less, and more preferably 1 μm or more. As described above, in a case where the first piezoelectric film 14 and the second piezoelectric film 18 are composed of a perovskite-type oxide having the same composition and the first piezoelectric film 14 is the one piezoelectric film, the film thickness t1 of the first piezoelectric film 14 may be made thicker than the film thickness t2 of the second piezoelectric film 18. On the contrary, in a case where the second piezoelectric film 18 is the one piezoelectric film, the film thickness t2 of the second piezoelectric film 18 may be made thicker than the film thickness t1 of the first piezoelectric film 14.

As described above, in the piezoelectric element 1, two layers of piezoelectric films having spontaneous polarizations aligned in the same direction along the film thickness direction are laminated with the electrode interposed therebetween, the hysteresis width of the other piezoelectric film is smaller than the hysteresis width of the one piezoelectric film, and the coercive voltage is small. With this configuration, as compared with a piezoelectric element comprising two layers of piezoelectric films having the same hysteresis curve, high piezoelectric performance can be obtained in a low voltage region in a case where an electric field in the same direction as the direction of the spontaneous polarization is applied to the one piezoelectric film, and an electric field in a direction opposite to the direction of the spontaneous polarization is applied to the other piezoelectric film to perform driving. Here, the low voltage region refers to a voltage region suitable for a case where the piezoelectric element is assumed to be incorporated in a consumer device, and specifically, a voltage region with an absolute value of 12 V or less. It is preferable that high piezoelectric performance can be obtained at a voltage of 7 V or less, and further 5 V or less.

The first piezoelectric film 14 and the second piezoelectric film 18 have the spontaneous polarizations P1 and P2 aligned in the same direction, and in a case where an electric field in the same direction as the direction of the spontaneous polarization P1 is applied to the first piezoelectric film 14 and an electric field in a direction opposite to the direction of the spontaneous polarization P2 is applied to the second piezoelectric film 18, the electric field may be applied by using the first electrode 12 and the third electrode 20 as the same pole, and using the second electrode 16 as a different pole from the first electrode 12 and the third electrode 20. Therefore, since a drive circuit having one polarity can be used for driving, it is possible to reduce the cost as compared with a case where two drive circuits having different polarities are provided.

It is preferable that the piezoelectric element 1 is configured such that the first electrode 12 and the third electrode 20 are connected. In a case where the first electrode 12 and the third electrode 20 are connected, drive control is easy.

The first piezoelectric film 14 and the second piezoelectric film 18 have the spontaneous polarizations aligned in the same direction and do not require a poling treatment. The first piezoelectric film 14 and the second piezoelectric film 18 can be formed using the same material and film formation method, so that cost reduction can be achieved.

Figure 3:
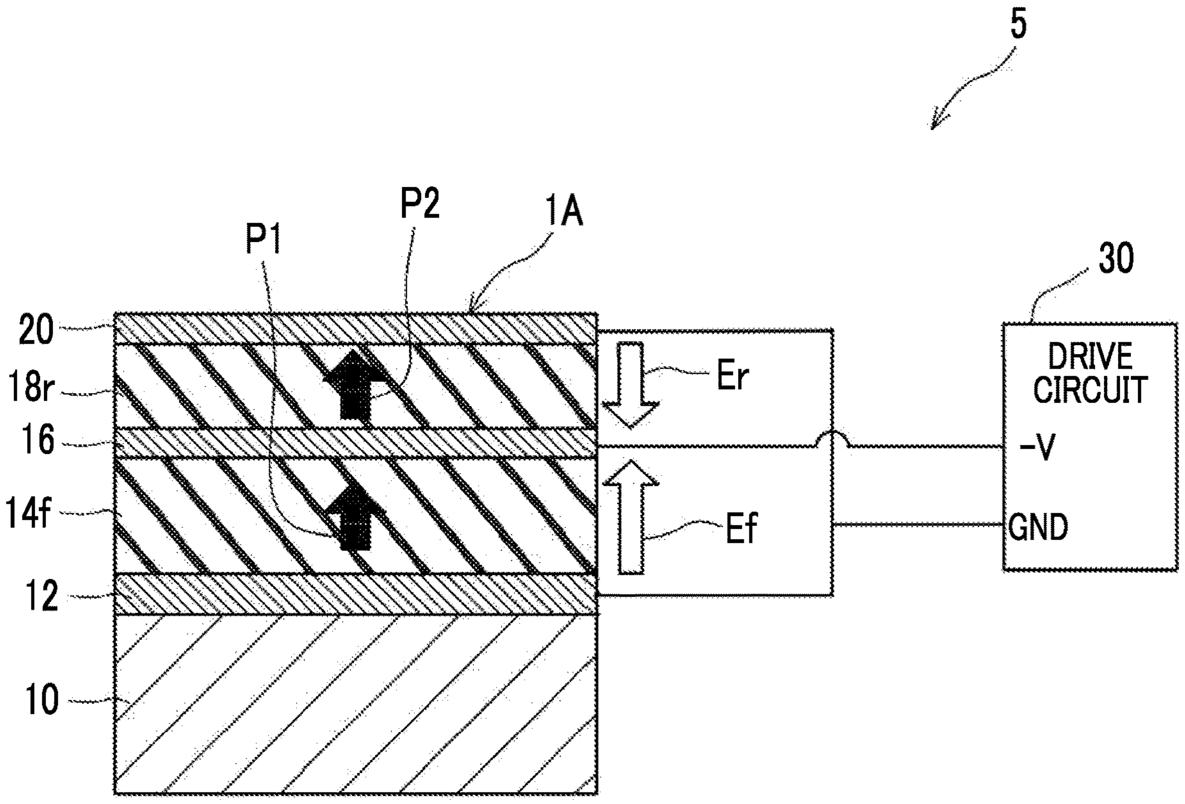
FIG. 3 is a diagram showing a schematic configuration of an actuator.

FIG. 3 shows a schematic configuration of an actuator 5 comprising a piezoelectric element 1A. In addition, in the drawings after FIG. 3, the same components as those in FIG. 1 are designated by the same references. The actuator 5 includes the piezoelectric element 1A and a drive circuit 30. In the piezoelectric element 1A shown in FIG. 3, the first piezoelectric film **14*f* is the one piezoelectric film having the hysteresis curve of FIG. 2A, and the second piezoelectric film 18*r* is the other piezoelectric film having the hysteresis curve of FIG. 2B. Here, the first piezoelectric film 14*f* and the second piezoelectric film 18*r* are composed of a perovskite-type oxide having the same composition, and the film thickness t2 of the second piezoelectric film 18*r* is thinner than the film thickness t1 of the first piezoelectric film 14*f***.

The drive circuit 30 is means for supplying a drive voltage to the piezoelectric film sandwiched between the electrodes. In this example, the first electrode 12 and the third electrode 20 are connected to a ground terminal of the drive circuit 30 and are set to a ground potential. The second electrode 16 is connected to a drive voltage output terminal of the drive circuit 30 and functions as a drive electrode. Accordingly, the drive circuit 30 applies a drive voltage to the first piezoelectric film **14*f* and the second piezoelectric film 18*r*. In this example, the drive circuit 30 applies an electric field Ef in the same direction as the direction of the spontaneous polarization P1 to the first piezoelectric film 14*f*, and applies an electric field Er in a direction opposite to the direction of the spontaneous polarization P2 to the second piezoelectric film 18*r*. That is, the drive circuit 30** is a negative drive circuit that executes a negative drive for applying a negative potential to the drive electrode.

Figure 4:
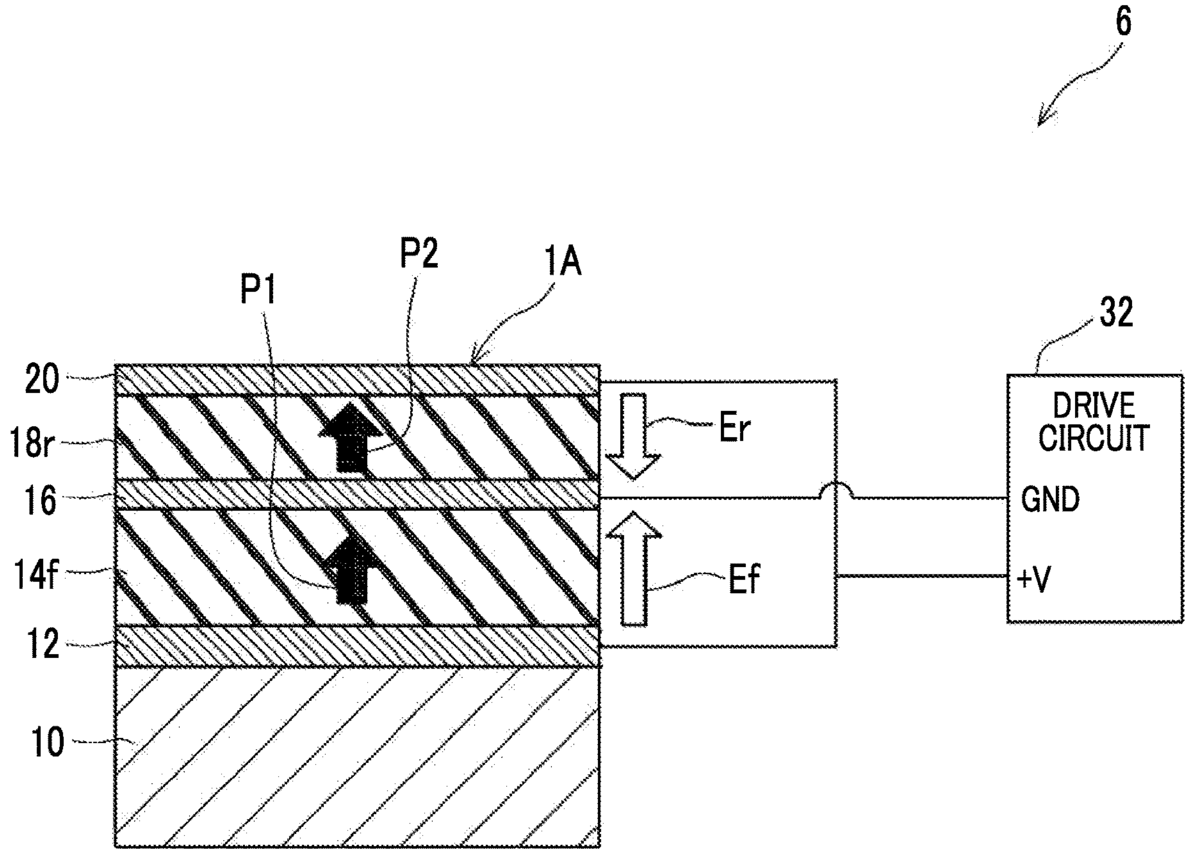
FIG. 4 is a diagram showing a schematic configuration of an actuator of a modification example.

On the other hand, as in an actuator 6 of a modification example shown in FIG. 4, a drive circuit 32 that executes a positive drive for applying a positive potential to the drive electrode may be provided. In the example shown in FIG. 4, the second electrode 16 is connected to a ground terminal of the drive circuit 32 and is set to a ground potential. The first electrode 12 and the third electrode 20 are connected to a drive voltage output terminal of the drive circuit 32 and function as drive electrodes. In this case, since the drive circuit 32 is a positive drive circuit, the electric field Ef in the same direction as the direction of the spontaneous polarization P1 can be applied to the first piezoelectric film 14*f*, and the electric field Er in a direction opposite to the direction of the spontaneous polarization P2 can be applied to the second piezoelectric film 18*r*.

The actuators 5 and 6 comprising the piezoelectric element 1A need only be provided with a drive circuit having one polarity and can be realized at low costs. Since the piezoelectric element 1A is provided, large piezoelectric performance can be obtained in a low voltage region.

Further, as described above, the second piezoelectric film 18 in the piezoelectric element 1 shown in FIG. 1 may be the one piezoelectric film having the hysteresis curve shown in FIG. 2A, and the first piezoelectric film 14 may be the other piezoelectric film having the hysteresis curve shown in FIG. 2B. Here, in a case where the second piezoelectric film 18 is the one piezoelectric film having the hysteresis curve shown in FIG. 2A, it is referred to as a second piezoelectric film 18*f*, and in a case where the first piezoelectric film 14 is the other piezoelectric film having the hysteresis curve shown in FIG. 2B, it is referred to as a first piezoelectric film 14*r*.

Figure 5:
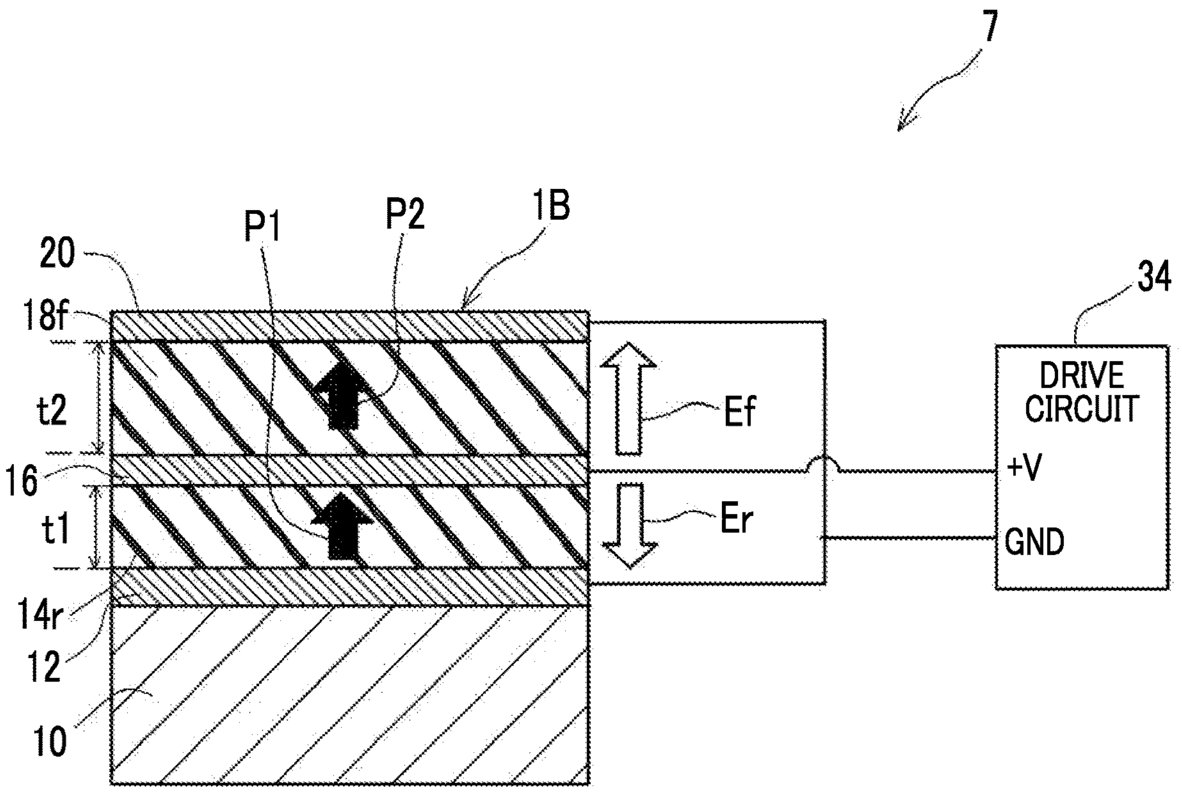
FIG. 5 is a diagram showing a schematic configuration of a piezoelectric element and an actuator of a modification example.

In the piezoelectric element 1B shown in FIG. 5, for example, the first piezoelectric film 14*r* and the second piezoelectric film 18*f* are composed of a perovskite-type oxide having the same composition, and the film thickness t1 of the first piezoelectric film 14*r* is thinner than the film thickness t2 of the second piezoelectric film 18*f*.

In this case, by applying the electric field Ef in the same direction as the direction of the spontaneous polarization P2 to the second piezoelectric film 18*f*, and applying the electric field Er in a direction opposite to the direction of the spontaneous polarization P1 to the first piezoelectric film 14*r*, good piezoelectric performance can be obtained in a low voltage region by a drive circuit having one polarity.

In an actuator 7 shown in FIG. 5, the first electrode 12 and the third electrode 20 are connected to a ground terminal of a drive circuit 34 and are set to a ground potential. The second electrode 16 is connected to a drive voltage output terminal of the drive circuit 34 and functions as a drive electrode. The drive circuit 34 is a positive drive circuit.

In a case where the piezoelectric element 1B is used, a configuration may be adopted in which a negative drive circuit is provided, the second electrode 16 is connected to the ground terminal to be a ground potential, and the first electrode 12 and the third electrode 20 are connected to the drive voltage output terminal to function as a drive electrode.

Figure 6:
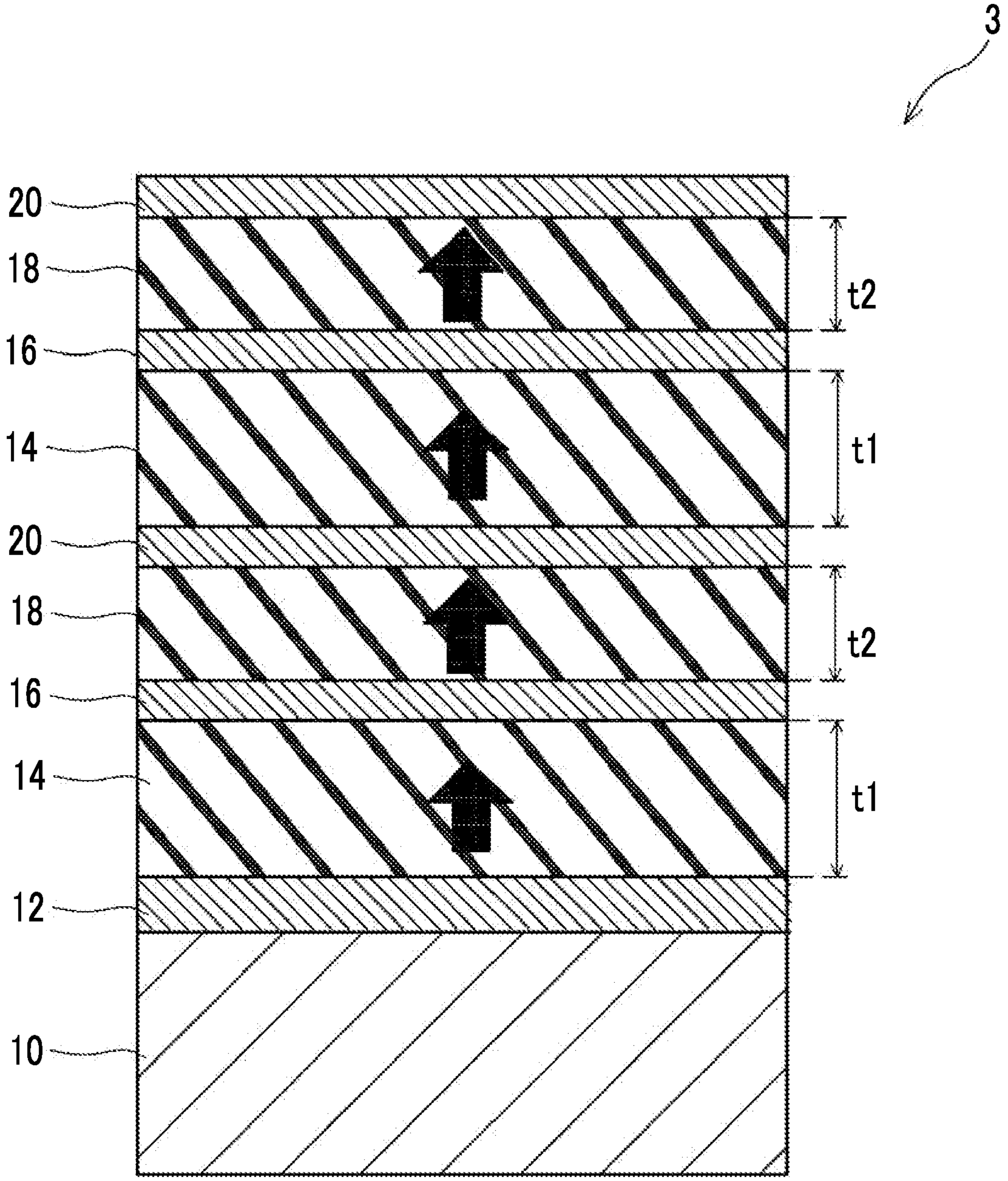
FIG. 6 is a cross-sectional view of a piezoelectric element of a modification example.

In addition, the piezoelectric element 1 shown in FIG. 1 is a two-layered piezoelectric element in which two layers of piezoelectric films including one first piezoelectric film 14 and one second piezoelectric film 18 are laminated. However, the piezoelectric element according to the present disclosure is not limited to two layers, and may include three or more layers of piezoelectric films. As in a piezoelectric element 3 shown in FIG. 6, a plurality of the first piezoelectric films 14 and a plurality of the second piezoelectric films 18 may be provided alternately. The piezoelectric element 3 has the first electrode 12, the first piezoelectric film 14, the second electrode 16, the second piezoelectric film 18, the third electrode 20, the first piezoelectric film 14, the second electrode 16, the second piezoelectric film 18, and the third electrode 20 which are laminated on the substrate 10 in this order. As described above, a plurality of layers of piezoelectric films having the hysteresis curve shown in FIG. 2A and other piezoelectric films having the hysteresis curve shown in FIG. 2B may be alternately provided via the electrodes.

Here, a principle in which the piezoelectric element 1 exhibits large piezoelectric performance in a low voltage region will be described.

Figure 7:
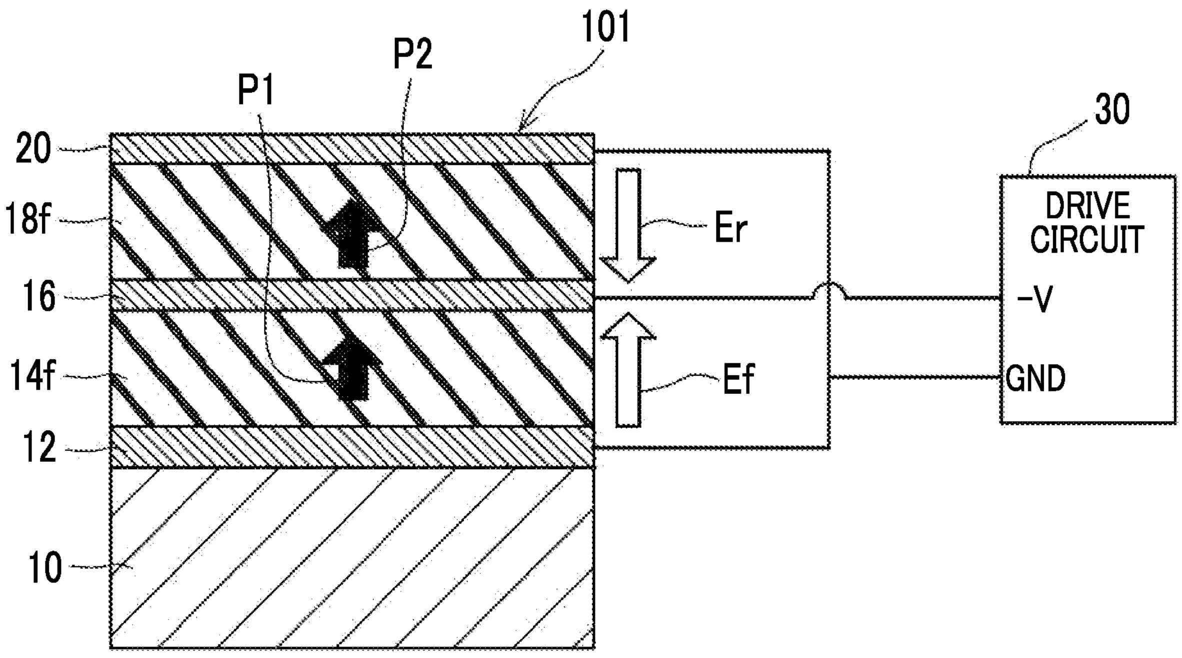
FIG. 7 is a diagram for explaining a problem of a multilayered piezoelectric element.

A piezoelectric element 101 shown in FIG. 7 is a multi-layered piezoelectric element for comparative purposes. In the piezoelectric element 101, both the first piezoelectric film 14*f* and the second piezoelectric film 18*f* are piezoelectric films showing the hysteresis curve shown in FIG. 2A. First, the piezoelectric performance of the piezoelectric element 101 will be described (see Comparative Example 2 described below).

Figure 8A:
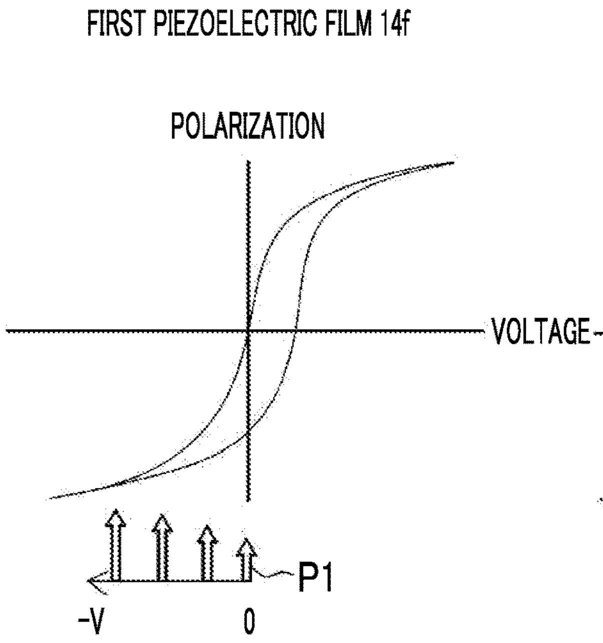
FIG. 8A is a hysteresis curve of a first piezoelectric film 14*f*.
Figure 8B:
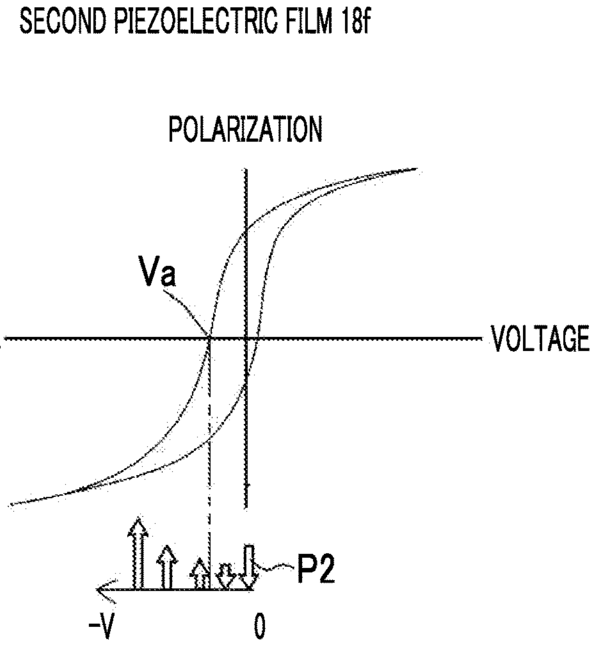
FIG. 8B is a hysteresis curve of a second piezoelectric film 18*f*.

FIGS. 8A and 8B show the P-V hysteresis curves of the first piezoelectric film 14*f* and the second piezoelectric film 18*f*, respectively, in a case where the first electrode 12 and the third electrode 20 are grounded and the second electrode 16 is used as a drive electrode as shown in FIG. 7. Since the first piezoelectric film 14*f* and the second piezoelectric film 18*f* have the same composition and film thickness, in a case where the lower electrode is grounded and the upper electrode is used as the drive electrode, both have the hysteresis curve of FIG. 8A. However, here, regarding the second piezoelectric film 18*f*, since the third electrode 20 which is an upper electrode is grounded and the second electrode 16 which is a lower electrode is used as a drive electrode, the hysteresis curve of FIG. 8B is a hysteresis curve obtained by rotating the hysteresis curve shown in FIG. 8A by 180° about the origin.

Figure 8C:
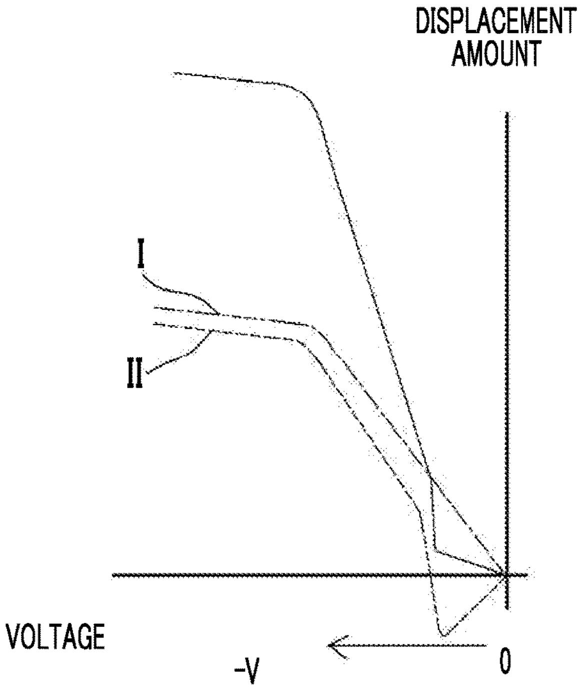
FIG. 8C is a diagram showing a displacement amount with respect to a voltage of a piezoelectric element 101.

A potential of 0 to −V is applied to the second electrode 16 such that the electric field Ef in the same direction as the direction of the spontaneous polarization P1 is applied to the first piezoelectric film 14*f* and the electric field Er in a direction opposite to the direction of the spontaneous polarization P2 is applied to the second piezoelectric film 18*f*. Here, the first piezoelectric film 14*f* and the second piezoelectric film 18*f* expand and contract in an in-plane direction in a $d_{31}$ mode with the application of a voltage, and the substrate 10 bends with the expansion and contraction of these piezoelectric films. FIG. 8C schematically shows a voltage dependence of a displacement amount of one point of the substrate 10 in this case.

In a case where the potential applied to the second electrode 16 in FIG. 7 is changed from 0 to −V, an electric field in the same direction as the direction of the spontaneous polarization P1 is applied to the first piezoelectric film 14*f*. Therefore, as shown by arrows below the hysteresis curve in FIG. 8A, the magnitude of the polarization gradually increases in the same direction as the direction of the spontaneous polarization P1 as the potential changes from 0 to −V. Therefore, the displacement amount in a case where a voltage of 0 to −V is applied only to the first piezoelectric film 14*f* increases as V increases, as shown by the one-dot chain line I in FIG. 8C. In a case where the drive potential applied to the second electrode 16 in FIG. 7 is changed from 0 to −V, the electric field Er in a direction opposite to the direction of the spontaneous polarization P2 is applied to the second piezoelectric film 18*f*. Therefore, as shown by arrows below the hysteresis curve in FIG. 8B, as the applied potential changes from 0 to −V, the polarization in the direction of the spontaneous polarization P2 gradually decreases, and the polarization in the same direction as the electric field gradually increases after the polarization is reversed at a coercive voltage Va. Therefore, as shown by the broken line II in FIG. 8C, the displacement amount in a case where a voltage of 0 to −V is applied only to the second piezoelectric film 18*f* is displaced in the opposite direction up to the coercive voltage at which a value of the polarization is 0. In a case where the first piezoelectric film 14*f* and the second piezoelectric film 18*f* are driven at the same time, as shown by the solid line in FIG. 8C, they behave such that the displacement amounts of both are added. Therefore, in a case where the first piezoelectric film 14*f* and the second piezoelectric film 18*f* are driven at the same time, a very large displacement amount can be obtained on the high voltage side, but the displacement amount in the low voltage region is smaller than the displacement amount obtained with only one layer of a piezoelectric film.

Figure 9:
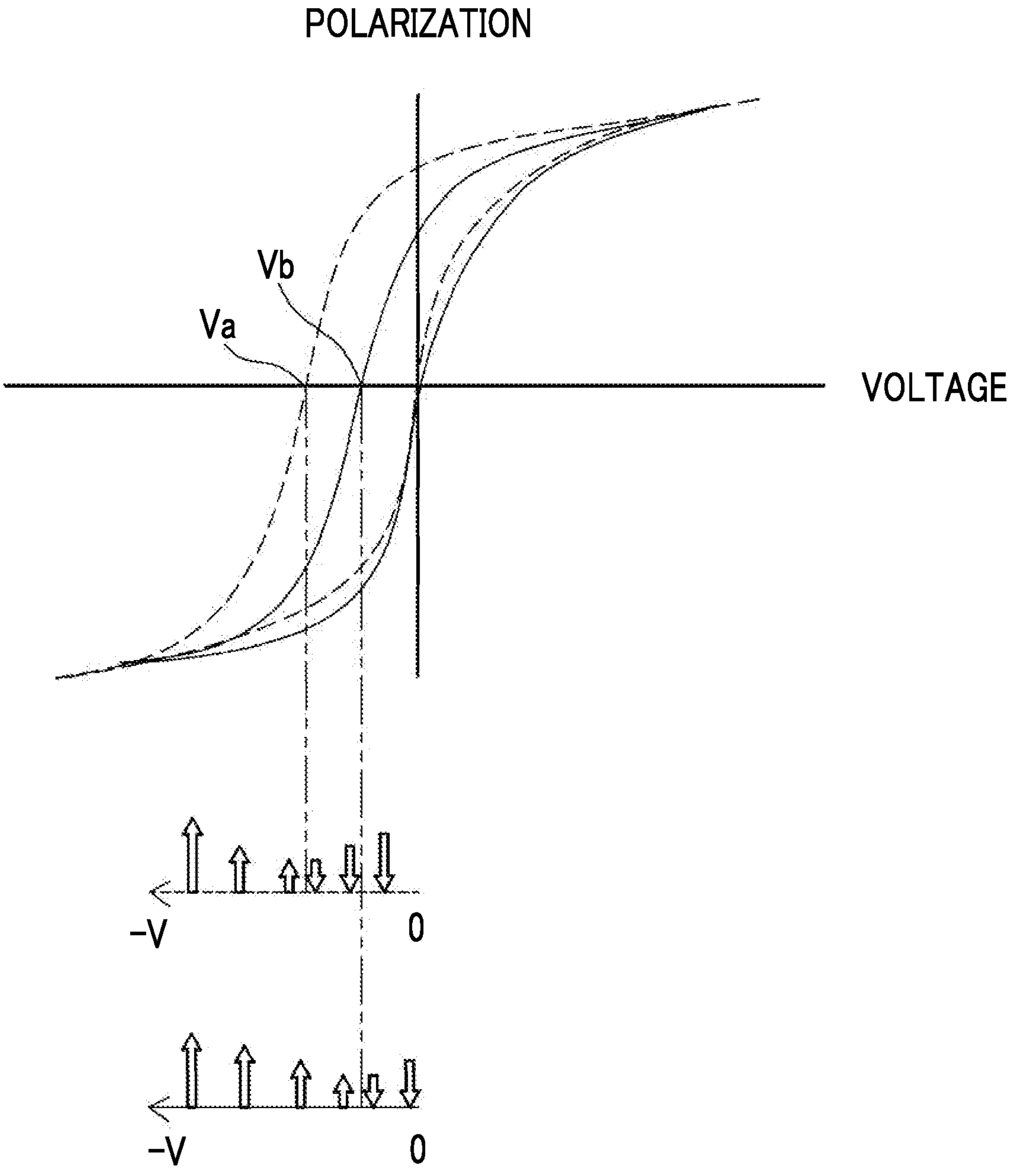
FIG. 9 is an explanatory diagram of an effect of the piezoelectric element according to the present embodiment.

On the other hand, for example, in the piezoelectric element 1A shown in FIG. 3, the hysteresis width of the second piezoelectric film 18*r* is smaller than the hysteresis width of the first piezoelectric film 14*f*, and the coercive voltage is small. Here, the hysteresis curve obtained with respect to the second piezoelectric film 18*r* using the second electrode 16 as a drive electrode and the hysteresis curve shown in FIG. 8B are shown superimposed in FIG. 9. In FIG. 9, the hysteresis curve shown by the broken line is the hysteresis curve shown in FIG. 8B, and the hysteresis curve shown by the solid line is that of the second piezoelectric film 18*r* of the piezoelectric element 1A. A coercive voltage Vb of the solid line hysteresis curve is located closer to the origin side than the coercive voltage Va of the broken line hysteresis curve. That is, as schematically shown below the hysteresis in FIG. 9, in a case where a drive voltage for applying an electric field in a direction opposite to the direction of the spontaneous polarization P2 is applied to the second piezoelectric film 18*r* of the piezoelectric element 1A, polarization reversal occurs on the lower voltage side than in a case where a drive voltage for applying an electric field in a direction opposite to the direction of the spontaneous polarization P2 is applied to the piezoelectric film showing the broken line hysteresis curve, that is, the second piezoelectric film 18*f* of the piezoelectric element 101.

Figure 10:
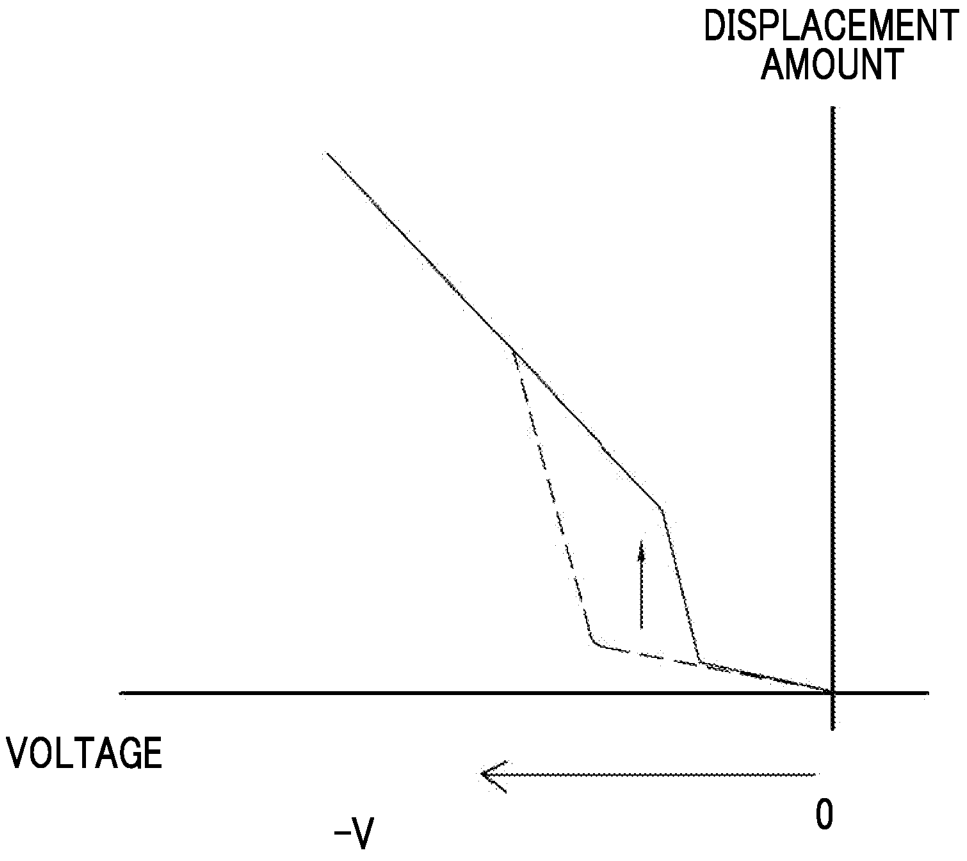
FIG. 10 is an explanatory diagram of an effect of a piezoelectric element according to the present embodiment.

FIG. 10 is a schematic diagram of a voltage dependence of the displacement amount, in which a change in the displacement amount in a case where the piezoelectric element 101 of FIG. 7 is driven with a drive voltage of 0 to −V is shown by the broken line, and a change in the displacement amount in a case where the piezoelectric element 1A in FIG. 3 is driven with a drive voltage of 0 to −V is shown by the solid line. As shown in FIG. 10, in a case where a drive voltage of 0 to −V is applied, the piezoelectric element 1A can obtain a large displacement in a low voltage region as compared with the piezoelectric element 101 of FIG. 7.

EXAMPLES

Hereinafter, specific examples and comparative examples of the piezoelectric element according to the present disclosure will be described. First, a production method for a piezoelectric element of each example will be described. A radio frequency (RF) sputtering device was used for the deposition of each layer. The description of the manufacturing method will be made with reference to the references of the respective layers of the piezoelectric element 1 shown in FIG. 1.

Deposition of First Electrode

A thermal oxide film-attached silicon substrate was used as the substrate 10. The first electrode 12 was deposited on the substrate 10 by radio-frequency (RF) sputtering. Specifically, as the first electrode 12, a TiW layer and an Ir layer were laminated on the substrate 10 in this order. The sputtering conditions for respective layers were as follows.

Sputtering Conditions for TiW Layer

Distance between target and substrate: 100 mm
Target input power: 600 W
Ar gas pressure: 0.5 Pa
Set temperature of substrate: 350° C.

Sputtering Conditions for Ir Layer

Distance between target and substrate: 100 mm
Target input power: 600 W
Ar gas pressure: 0.1 Pa
Set temperature of substrate: 350° C.

First Piezoelectric Film

The substrate 10 with the first electrode 12 attached thereto was placed in the inside of an RF sputtering device, and an Nb-doped PZT film in which an Nb addition amount to the B site was set to 12 at % was formed as the first piezoelectric film 14. The Nb-doped PZT was used as a target, and the sputtering conditions were as follows. An amount of Pb in the target was set to be larger than a stoichiometric composition, and a Ti/Zr molar ratio was set to the MPB composition (Ti/Zr=52/48).

Sputtering Conditions for First Piezoelectric Film

Distance between target and substrate: 60 mm
Target input power: 500 W
Vacuum degree: 0.3 Pa, an Ar/$O_2$ mixed atmosphere ($O_2$ volume fraction: 10%)
Set temperature of substrate: 700° C.

The film thickness t1 of the first piezoelectric film 14 was as shown in Table 1 for each Example and Comparative Example. The film thickness t1 was adjusted by changing a film formation time.

Second Electrode

As the second electrode 16, $IrO_z$ (Z≤2) of 50 nm and Ir of 100 nm were laminated on the first piezoelectric film 14 in this order. The sputtering conditions were as follows.

Sputtering Conditions for $IrO_z$ and Ir

Distance between target and substrate: 100 mm
Target input power: 200 W
Vacuum degree: 0.3 Pa, an Ar atmosphere during Ir film formation, an Ar/$O_2$ mixed atmosphere during $IrO_z$ film formation ($O_2$ volume fraction: 5%)
Set Temperature of Substrate: Room Temperature Second Piezoelectric Film As the second piezoelectric film 18, the Nb-doped PZT film in which the Nb addition amount to the B site was 12 at % was formed on the second electrode 16. The same target was used for film formation of the first piezoelectric film 14 and the second piezoelectric film 18, and the film formation conditions were also the same. The film thickness t2 of the second piezoelectric film 18 was set as shown in Table 1 for each Example and Comparative Example. The film thickness t2 was adjusted by changing a film formation time. Comparative Example 1 was a piezoelectric element having a single layer of the first piezoelectric film 14 not provided with the second piezoelectric film 18 and the third electrode 20.

Third Electrode

As the third electrode 20, $IrO_z$ of 50 nm and Ir of 100 nm were laminated on the second piezoelectric film 18 in this order. The sputtering conditions were the same as those of the second electrode 16.

Formation of Electrode Pattern for Evaluation

In Comparative Example 1, in order to form electrode pads for applying a voltage to the first electrode 12 and the second electrode 16, the second electrode 16 and the first piezoelectric film 14 were sequentially patterned by photolithography and dry etching.

In Comparative Example 2 and Examples, in order to form electrode pads for applying a voltage to the first electrode 12, the second electrode 16, and the third electrode 20, the third electrode 20, the second piezoelectric film 18, the second electrode 16, and the first piezoelectric film 14 were sequentially patterned by photolithography and dry etching.

By the above process, a laminate obtained by laminating electrodes and piezoelectric layers was produced.

Preparation of Evaluation Sample

Evaluation Sample 1

A strip-shaped portion of 2 mm×25 mm was cut out from the laminate to prepare a cantilever as an evaluation sample 1.

Evaluation Sample 2

A portion of 25 mm×25 mm having, at the center of the surface of the piezoelectric film, the third electrode that had been patterned in a circular shape having a diameter of 400 μm, was cut out from the laminate and used as an evaluation sample 2.

Measurement of Piezoelectric Characteristics

The piezoelectric constant $d_{31}$ was measured for the evaluation of the piezoelectric characteristics for each of Examples and Comparative Examples.

The measurement of the piezoelectric constant $d_{31}$ was carried out using the evaluation sample 1. According to a method described in I. Kanno et al., Sensor and Actuator A 107 (2003) 68, the piezoelectric constant $d_{31}$ was measured by grounding the first electrode 12 and the third electrode 20 and applying a drive signal to the second electrode 16. For each example, the piezoelectric constant $d_{31}$ was measured in a case where application voltages were −1, −3, −5, −7, −10, and −15 V, respectively. For example, the piezoelectric constant $d_{31}$ in a case where the application voltage was −1 V was measured by applying a drive signal obtained by adding a sinusoidal wave having an amplitude of 0.5 V to a bias voltage of −0.5 V to the second electrode 16. The measurement results are shown in Table 2.

Measurement of Polarization-Voltage Characteristics

For the piezoelectric elements of each Example and Comparative Example, a polarization-voltage (P-V) hysteresis curve was measured using the evaluation sample 2. The measurement was carried out by applying a voltage until saturation polarization was reached under a condition of a frequency of 1 kHz for each of the first piezoelectric film 14 and the second piezoelectric film 18 of the piezoelectric element of each Example and Comparative Example. In a case of measuring the hysteresis of the first piezoelectric film 14, a sweep voltage was applied to the first piezoelectric film 14 with the first electrode 12 being grounded and the second electrode 16 as a drive electrode. Further, in a case of measuring the hysteresis of the second piezoelectric film 18, a sweep voltage was applied to the second piezoelectric film 18 with the second electrode 16 being grounded and the third electrode 20 as a drive electrode.

Figure 11:
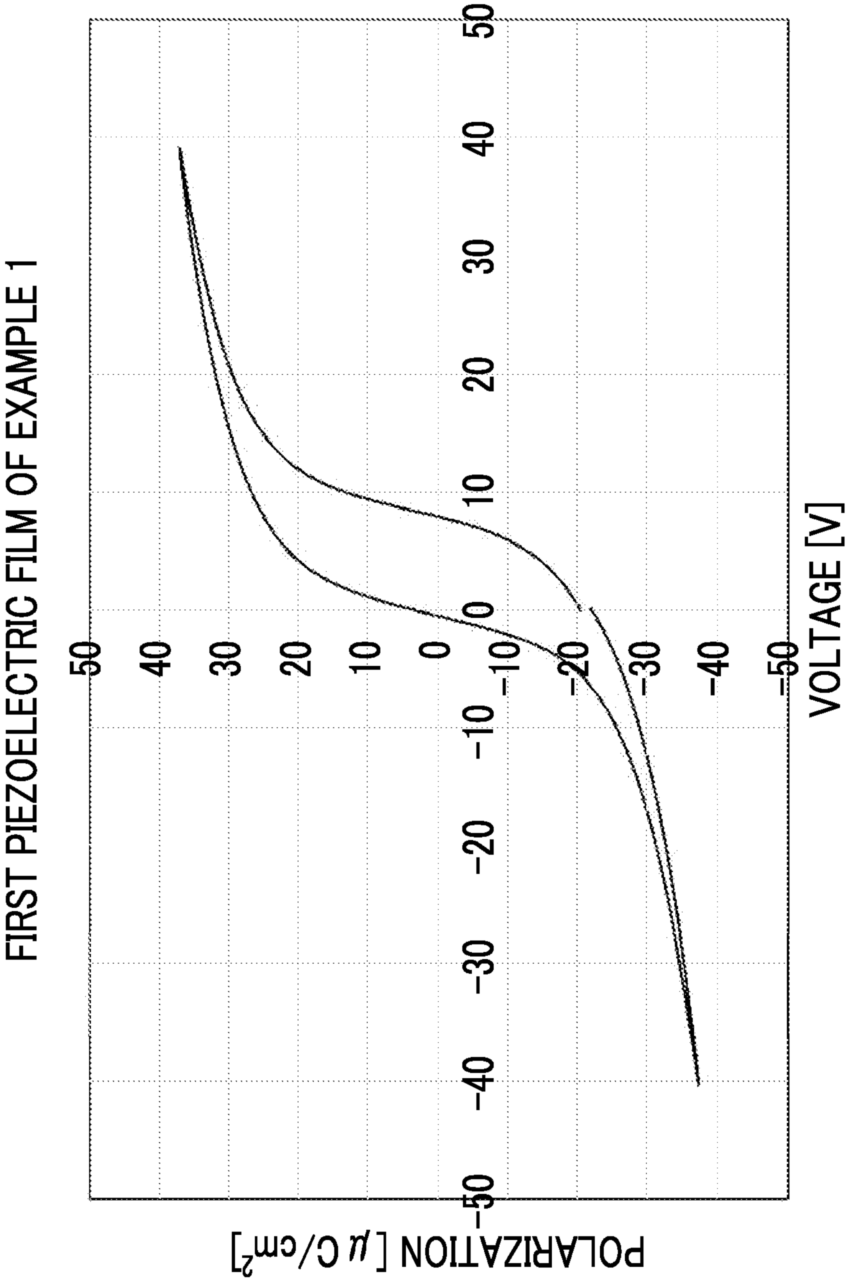
FIG. 11 is a diagram showing a polarization-voltage hysteresis curve of the first piezoelectric film of Example 1.

FIG. 11 is a P-V hysteresis curve obtained for the first piezoelectric film of the piezoelectric element of Example 1. Since all the first piezoelectric films of the piezoelectric elements of Comparative Examples 1 and 2 and Examples 2 to 8 have the same film thickness as the first piezoelectric film of Example 1, all of them have the characteristics represented by the hysteresis curve shown in FIG. 11. In the hysteresis curve shown in FIG. 11, the coercive voltage $Vcf^+$ on the positive side is 7.7 V, and the coercive voltage $Vcf^-$ on the negative side is −0.6 V. Therefore, ΔVcf is 8.3 V.

Figure 12:
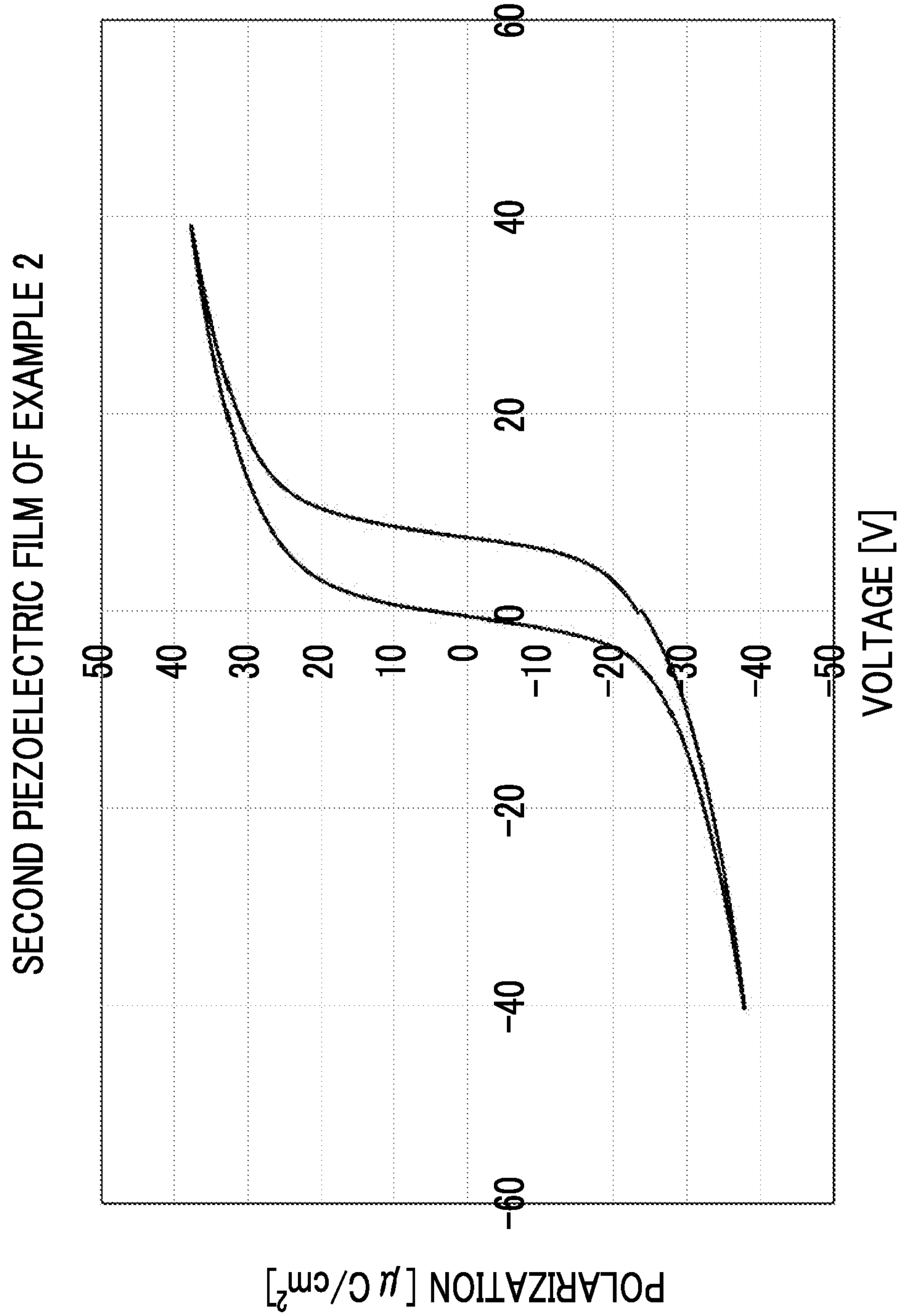
FIG. 12 is a diagram showing a polarization-voltage hysteresis curve of the second piezoelectric film of Comparative Example 2.

FIG. 12 is a P-V hysteresis curve obtained for the second piezoelectric film of the piezoelectric element of Comparative Example 2. In the hysteresis curve shown in FIG. 12, the coercive voltage $Vcr^+$ on the positive side is 7.6 V, and the coercive voltage $Vcr^-$ on the negative side is −0.5 V. Therefore, ΔVcr is 8.1 V. Since the measured value includes an error of about ±0.2 V, the width of the hysteresis curve shown in FIG. 12 can be regarded as substantially the same as that of the hysteresis curve shown in FIG. 11.

Figure 13:
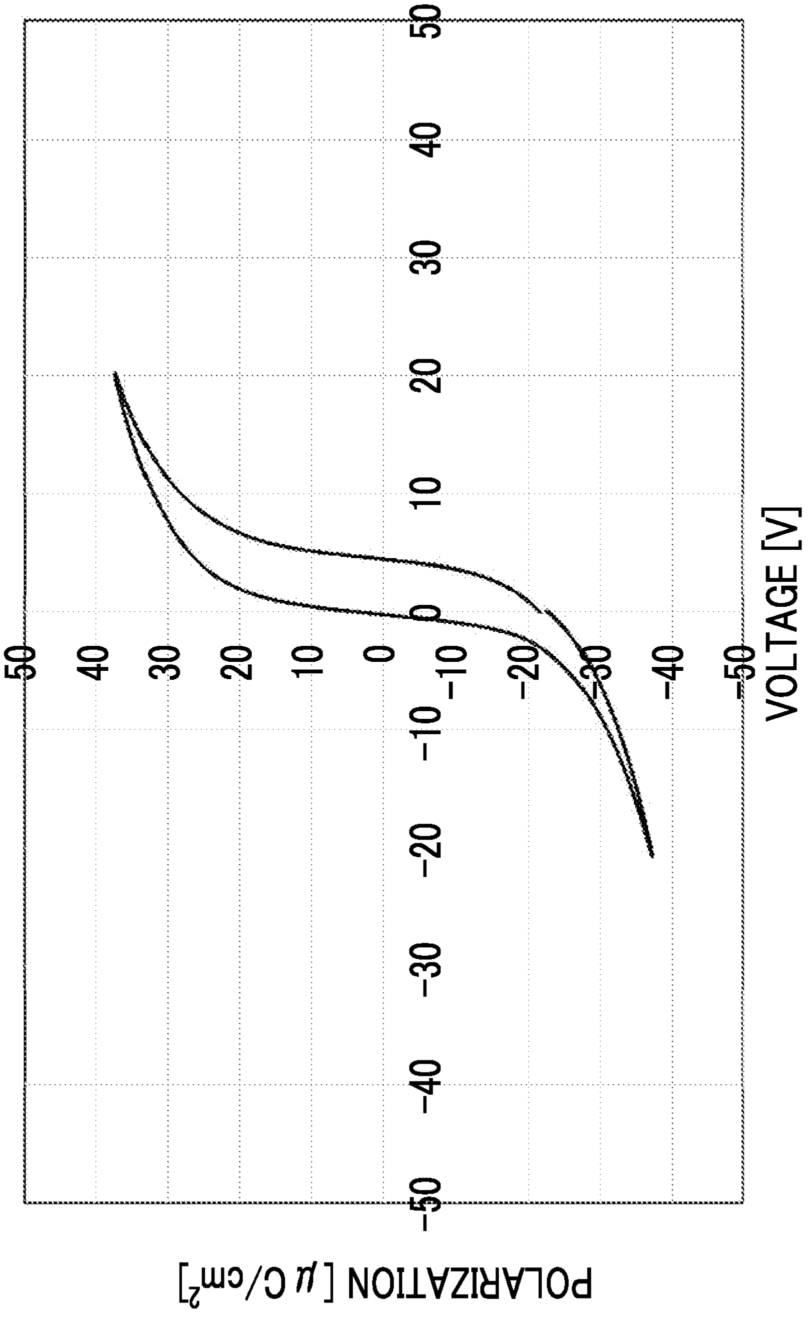
FIG. 13 is a diagram showing a polarization-voltage hysteresis curve of the second piezoelectric film of Example 4.

FIG. 13 is a P-V hysteresis curve obtained for the second piezoelectric film of the piezoelectric element of Example 4. In the hysteresis curve shown in FIG. 13, the coercive voltage $Vcr^+$ on the positive side is 4.4 V, and the coercive voltage $Vcr^-$ on the negative side is −0.3 V. Therefore, ΔVcr is 4.7 V.

Figure 14:
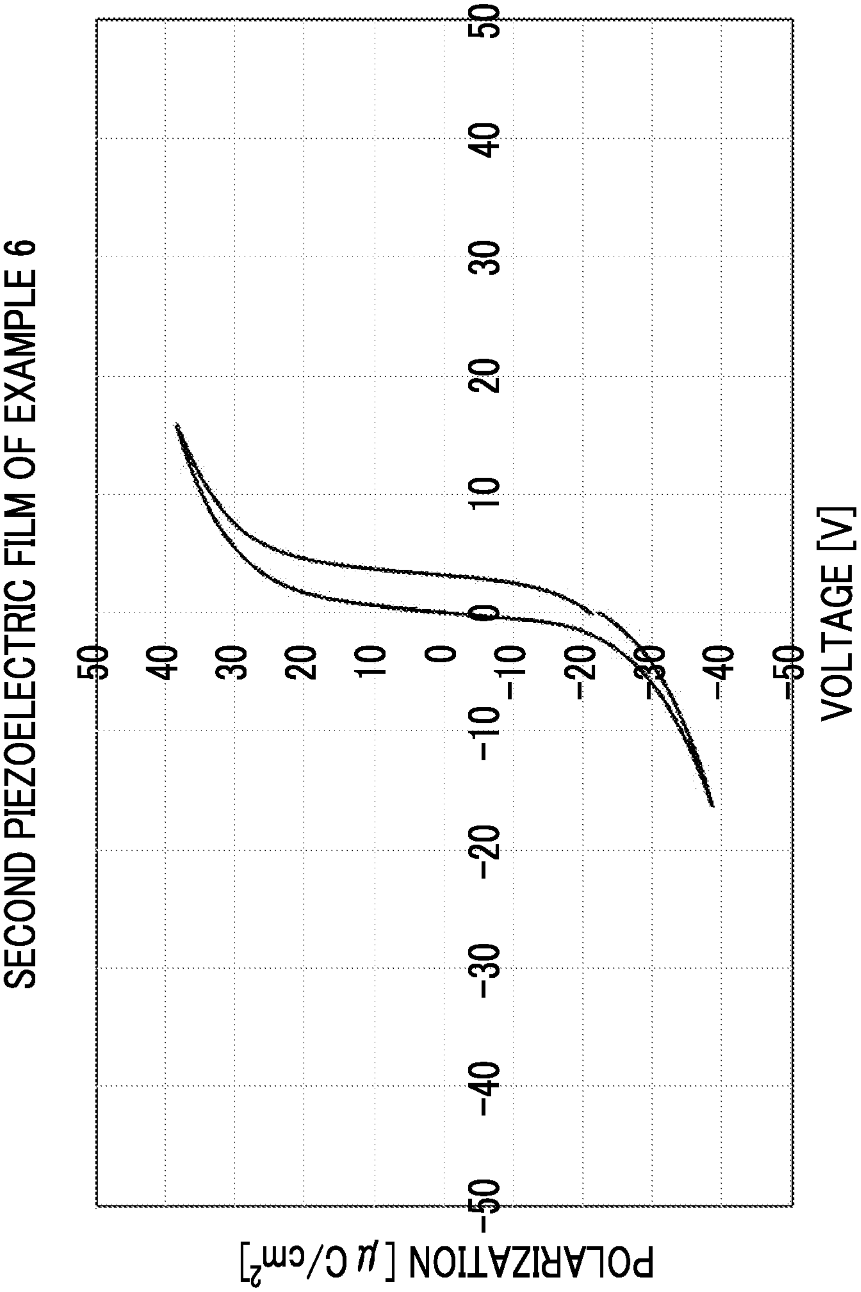
FIG. 14 is a diagram showing a polarization-voltage hysteresis curve of the second piezoelectric film of Example 6.

FIG. 14 is a P-V hysteresis curve obtained for the second piezoelectric film of the piezoelectric element of Example 6. In the hysteresis curve shown in FIG. 14, the coercive voltage $Vcr^+$ on the positive side is 3.1 V, and the coercive voltage $Vcr^-$ on the negative side is −0 V. Therefore, ΔVcr is 3.1 V.

Table 1 shows $Vcf^-$, $Vcf^+$, and ΔVcf in the hysteresis curve of the first piezoelectric film, and $Vcr^-$, $Vcr^+$, and ΔVcr in the hysteresis curve of the second piezoelectric film of the piezoelectric elements of each Example and Comparative Example, which are obtained as described above.

TABLE 1

| | First Piezoelectric Film | | | | Second Piezoelectric Film | | | |
|---|---|---|---|---|---|---|---|---|
| | Film Thickness [μm] | $Vcf^-$ [V] | $Vcf^+$ [V] | ΔVcf [V] | Film Thickness [μm] | $Vcr^-$ [V] | $Vcr^+$ [V] | ΔVcr [V] |
| Comparative Example 1 | 2 | −0.6 | 7.7 | 8.3 | — | — | — | — |
| Comparative Example 2 | 2 | −0.6 | 7.7 | 8.3 | 2 | −0.5 | 7.6 | 8.1 |
| Example 1 | 2 | −0.6 | 7.7 | 8.3 | 1.8 | −0.4 | 6.9 | 7.3 |
| Example 2 | 2 | −0.6 | 7.7 | 8.3 | 1.6 | −0.4 | 6.1 | 6.5 |
| Example 3 | 2 | −0.6 | 7.7 | 8.3 | 1.4 | −0.4 | 5.2 | 5.6 |
| Example 4 | 2 | −0.6 | 7.7 | 8.3 | 1.2 | −0.3 | 4.4 | 4.8 |
| Example 5 | 2 | −0.6 | 7.7 | 8.3 | 1 | −0.3 | 3.8 | 4 |
| Example 6 | 2 | −0.6 | 7.7 | 8.3 | 0.8 | 0 | 3.1 | 3.2 |
| Example 7 | 2 | −0.6 | 7.7 | 8.3 | 0.6 | −0.2 | 2.3 | 2.5 |
| Example 8 | 2 | −0.6 | 7.7 | 8.3 | 0.4 | −0.3 | 1.6 | 1.9 |

TABLE 1-continued

| | First Piezoelectric Film | | | | Second Piezoelectric Film | | | |
|---|---|---|---|---|---|---|---|---|
| | Film Thickness [μm] | $Vcf^-$ [V] | $Vcf^+$ [V] | ΔVcf [V] | Film Thickness [μm] | $Vcr^-$ [V] | $Ver^+$ [V] | ΔVer [V] |
| Example 9 | 3 | −0.8 | 12.1 | 12.9 | 1.5 | −0.2 | 6 | 6.2 |
| Example 10 | 1.5 | −0.5 | 5.9 | 6.4 | 0.8 | −0.1 | 3.2 | 3.3 |

TABLE 2

| | Piezoelectric Constant $d_{31}$ (pm/V) | | | | | |
|---|---|---|---|---|---|---|
| | Application voltage −1 V | Application voltage −3 V | Application voltage −5 V | Application voltage −7 V | Application voltage −10 V | Application voltage −15 V |
| Comparative Example 1 | 161 | 198 | 218 | 228 | 234 | 233 |
| Comparative Example 2 | 20 | 40 | 80 | 243 | 354 | 376 |
| Example 1 | 19 | 41 | 102 | 302 | 362 | 380 |
| Example 2 | 21 | 42 | 195 | 352 | 369 | 392 |
| Example 3 | 22 | 103 | 279 | 372 | 391 | 402 |
| Example 4 | 30 | 172 | 369 | 389 | 406 | 388 |
| Example 5 | 85 | 225 | 380 | 410 | 413 | 365 |
| Example 6 | 98 | 275 | 392 | 406 | 388 | 331 |
| Example 7 | 185 | 382 | 398 | 386 | 321 | 262 |
| Example 8 | 226 | 354 | 40 | 315 | x | x |
| Example 9 | 35 | 50 | 270 | 380 | 415 | 420 |
| Example 10 | 105 | 288 | 377 | 384 | 351 | 275 |

Figure 15:
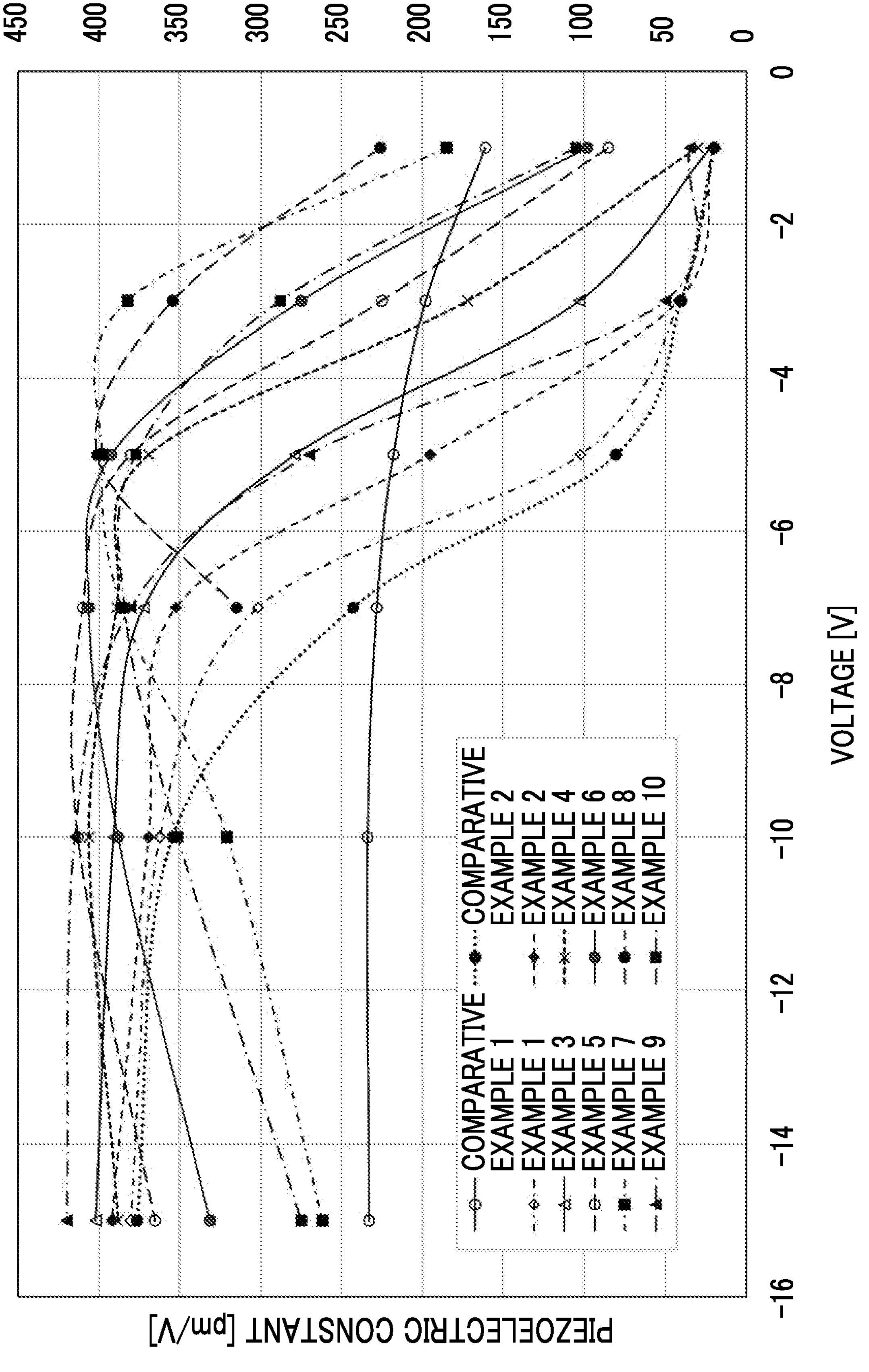
FIG. 15 is a graph showing a displacement amount in a low voltage region for the piezoelectric elements of Examples and Comparative Examples.

FIG. 15 is a graph showing a relationship between the application voltage and the piezoelectric constant $d_{31}$ for each piezoelectric element. In Examples 1 to 10, a piezoelectric constant larger than the piezoelectric constant $d_{31}$ of Comparative Examples 1 and 2, specifically, a piezoelectric constant which is at least 1.3 times the piezoelectric constant $d_{31}$ of Comparative Examples 1 and 2 is obtained in a case of driving at −7 V. In Comparative Example 2 comprising two layers of equivalent piezoelectric films, the piezoelectric constant $d_{31}$ at −7 V was slightly higher than the piezoelectric constant $d_{31}$ of Comparative Example 1, but the piezoelectric constant $d_{31}$ in a voltage region lower than 7 V was significantly lower than the piezoelectric constant $d_{31}$ of Comparative Example 1.

Examples 1 to 10 all satisfy $\Delta Vcr<\Delta Vcf-0.2$, and $Vcr<Vcf-0.2$.

In particular, Examples 1 to 6 and Examples 9 to 10 showed a piezoelectric constant larger than that of Comparative Examples 1 and 2 at 7 V, and good results were obtained in that the element was not destroyed at −15 V.

Example 7 showed the maximum piezoelectric constant $d_{31}$ at an application voltage of −5 V, and thereafter, the piezoelectric constant decreases as the voltage further increases, and it is considered that element destruction occurs at an application voltage of −15 V from a degree of decrease in numerical value. In addition, Example 8 showed the maximum piezoelectric constant $d_{31}$ at an application voltage of −5 V, and the element was destroyed at −10 V, so that the piezoelectric constant $d_{31}$ could not be measured. Since the second piezoelectric films of Examples 7 and 8 are thin, it is considered that a withstand voltage is low. However, at application voltages of −3 V to −5 V, a very high piezoelectric constant $d_{31}$ can be obtained as compared with Comparative Example 1, and it is clear that high piezoelectric performance can be obtained in a low voltage region.

What is claimed is:

1. A piezoelectric element comprising:

a substrate; and a first electrode, a first piezoelectric film, a second electrode, a second piezoelectric film, and a third electrode which are provided on the substrate in this order, wherein both the first piezoelectric film and the second piezoelectric film have spontaneous polarizations aligned in a film thickness direction and directions of the spontaneous polarizations of the first piezoelectric film and the second piezoelectric film are the same, and in a case where in a hysteresis curve showing polarization-voltage characteristics of one piezoelectric film of the first piezoelectric film and the second piezoelectric film, a coercive voltage on a positive side is denoted by $Vcf^+$, a coercive voltage on a negative side is denoted by $Vcf^-$, an absolute value $|Vcf^+-Vcf^-|$ of a difference between both coercive voltages is denoted by ΔVcf, and the larger of an absolute value of the coercive voltage $Vcf^+$ and an absolute value of the coercive voltage $Vcf^-$ is denoted by Vcf, and in a hysteresis curve showing polarization-voltage characteristics of the other piezoelectric film of the first piezoelectric film and the second piezoelectric film, a coercive voltage on a positive side is denoted by $Vcr^+$, a coercive voltage on a negative side is denoted by $Vcr^-$, an absolute value $|Vcr^+-Vcr^-|$ of a difference between both coercive voltages is denoted by ΔVcr, and the larger of an ab solute value of the coercive voltage $Vcr^+$ and an absolute value of the coercive voltage $Vcr^-$ is denoted by Vcr, $\Delta Vcr<\Delta Vcf-0.2$ and $Vcr<Vcf-0.2$, where, units are all [V], are satisfied.

2. The piezoelectric element according to claim 1, wherein $|Vcr^++Vcr^-|\leq\Delta Vcr$ is further satisfied.

3. The piezoelectric element according to claim 1, wherein an electric field in the same direction as a direction of the spontaneous polarization is applied to the one piezoelectric film, and an electric field in a direction opposite to the direction of the spontaneous polarization is applied to the other piezoelectric film.

4. The piezoelectric element according to claim 1, wherein the first electrode and the third electrode are connected to each other.

5. The piezoelectric element according to claim 1, wherein both the first piezoelectric film and the second piezoelectric film contain a perovskite-type oxide represented by General Formula $$Pb\{(Zr_xTi_{1-x})_{1-y}M_y\}O_3$$

where M is a metal element selected from the group consisting of V, Nb, Ta, Sb, Mo, and W, and $0<x<1$, and $0<y<1$ are satisfied.

6. The piezoelectric element according to claim 5, wherein the metal element M is Nb and y is greater than 0.1.

7. The piezoelectric element according to claim 1, wherein the first piezoelectric film and the second piezoelectric film have the same composition.

8. The piezoelectric element according to claim 7, wherein a film thickness of the other piezoelectric film is thinner than a film thickness of the one piezoelectric film.

9. An actuator comprising:

the piezoelectric element according to claim 1; and a drive circuit that applies a drive voltage to the piezoelectric element, wherein the drive circuit applies an electric field in the same direction as a direction of the spontaneous polarization to the one piezoelectric film, and applies an electric field in a direction opposite to the direction of the spontaneous polarization to the other piezoelectric film.

* * * * *